US012575125B2

(12) United States Patent
Lee et al.

(10) Patent No.: US 12,575,125 B2
(45) Date of Patent: Mar. 10, 2026

(54) FIELD EFFECT TRANSISTOR WITH SELECTIVE MODIFIED ACCESS REGIONS

(71) Applicant: Wolfspeed, Inc., Durham, NC (US)

(72) Inventors: Kyoung-Keun Lee, Cary, NC (US); Fabian Radulescu, Chapel Hill, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 287 days.

(21) Appl. No.: 17/325,643

(22) Filed: May 20, 2021

(65) Prior Publication Data

US 2022/0376098 A1    Nov. 24, 2022

(51) Int. Cl.
H10D 30/47        (2025.01)
H01L 21/265        (2006.01)
            (Continued)

(52) U.S. Cl.
CPC ......... H10D 30/475 (2025.01); H10D 30/015 (2025.01); H10D 62/17 (2025.01);
            (Continued)

(58) Field of Classification Search
CPC ................. H01L 29/7786; H01L 29/10; H01L 29/66462; H01L 21/26546; H01L 21/266; H01L 29/2003; H01L 29/205; H10D 30/475; H10D 30/015; H10D 62/17; H10D 62/8503
See application file for complete search history.

(56) References Cited

U.S. PATENT DOCUMENTS 6,849,882 B2    2/2005 Chavarkar et al.
7,126,426 B2    10/2006 Mishra et al.
            (Continued)

FOREIGN PATENT DOCUMENTS

JP        2012049216 A    3/2012
JP        2014508413 A    4/2014
            (Continued)

OTHER PUBLICATIONS

International Search Report and Written Opinion of the International Searching Authority, PCT/US2022/030173, mailed Sep. 9, 2022, 7 pages.
            (Continued)

*Primary Examiner* — Norman D Richards
*Assistant Examiner* — Sean Ayers Winters
(74) *Attorney, Agent, or Firm* — Sage Patent Group

(57) ABSTRACT

A transistor device ac includes a semiconductor epitaxial layer structure including a channel layer and a barrier layer on the channel layer, wherein the barrier layer has a higher bandgap than the channel layer, a source contact and a drain contact on the barrier layer, and a gate contact on the barrier layer between source contact and the drain contact. The device further includes a plurality of selective modified access regions at an upper surface of the barrier layer opposite the channel layer. The selective modified access regions include a material having a lower surface barrier height than the barrier layer, and the plurality of selective modified access regions are spaced apart on the barrier layer along a length of the gate contact.

27 Claims, 24 Drawing Sheets

(51) Int. Cl.

| | |
|---|---|
| *H01L 21/266* | (2006.01) |
| *H10D 30/01* | (2025.01) |
| *H10D 62/17* | (2025.01) |
| *H10D 62/824* | (2025.01) |
| *H10D 62/85* | (2025.01) |

(52) U.S. Cl.

CPC ...... *H01L 21/26546* (2013.01); *H01L 21/266* (2013.01); *H10D 62/824* (2025.01); *H10D 62/8503* (2025.01)

(56) References Cited

U.S. PATENT DOCUMENTS

| | | | |
|---|---|---|---|
| 7,230,284 | B2 | 6/2007 | Parikh et al. |
| 7,501,669 | B2 | 3/2009 | Parikh et al. |
| 7,550,783 | B2 | 6/2009 | Wu et al. |
| 7,573,078 | B2 | 8/2009 | Wu et al. |
| 7,709,859 | B2 | 5/2010 | Smith et al. |
| 7,906,799 | B2 | 3/2011 | Sheppard et al. |
| 9,666,707 | B2 | 5/2017 | Sheppard et al. |
| 9,679,762 | B2 | 6/2017 | Edwards et al. |
| 9,847,411 | B2 | 12/2017 | Sriram et al. |
| 9,984,881 | B2 | 5/2018 | Sheppard et al. |
| 10,672,763 | B2 | 6/2020 | Jiang |
| 10,971,612 | B2 | 4/2021 | Bothe et al. |
| 2005/0059197 | A1* | 3/2005 | Yamashita .......... H01L 29/7787 |
| | | | 257/E29.127 |
| 2005/0253167 | A1 | 11/2005 | Wu et al. |
| 2006/0202272 | A1 | 9/2006 | Wu et al. |
| 2008/0128752 | A1 | 6/2008 | Wu |
| 2010/0025730 | A1* | 2/2010 | Heikman .............. H01L 29/402 |
| | | | 257/E21.403 |
| 2010/0276698 | A1 | 11/2010 | Moore et al. |
| 2011/0140172 | A1* | 6/2011 | Chu ................... H01L 29/6609 |
| | | | 438/106 |
| 2012/0049973 | A1 | 3/2012 | Smith, Jr. et al. |
| 2012/0194276 | A1 | 8/2012 | Fisher |
| 2012/0309172 | A1 | 12/2012 | Romano et al. |
| 2013/0341635 | A1 | 12/2013 | Cao et al. |

| | | | |
|---|---|---|---|
| 2014/0001557 | A1* | 1/2014 | Mishra ................ H01L 29/7786 |
| | | | 257/E21.409 |
| 2014/0183434 | A1 | 7/2014 | Lim et al. |
| 2016/0020313 | A1* | 1/2016 | Wu ...................... H01L 29/7787 |
| | | | 257/194 |
| 2017/0092752 | A1* | 3/2017 | Lu ........................ H01L 29/7783 |
| 2018/0130873 | A1 | 5/2018 | Eum et al. |
| 2018/0158909 | A1* | 6/2018 | Mishra ................ H01L 29/0619 |
| 2019/0157440 | A1 | 5/2019 | Green et al. |
| 2019/0371909 | A1* | 12/2019 | Banerjee ........... H01L 21/28264 |
| 2020/0006522 | A1* | 1/2020 | Yeh ................... H01L 29/66462 |
| 2020/0044067 | A1* | 2/2020 | Banerjee ........... H01L 21/30621 |
| 2020/0083167 | A1* | 3/2020 | LaRoche .............. H01L 29/475 |
| 2020/0185508 | A1* | 6/2020 | Macelwee ......... H01L 29/66462 |
| 2020/0328296 | A1* | 10/2020 | Hwang ............. H01L 29/66462 |
| 2021/0104601 | A1 | 4/2021 | Luo et al. |
| 2021/0273084 | A1* | 9/2021 | Chen ................. H01L 21/02381 |
| 2022/0130965 | A1 | 4/2022 | Bothe et al. |
| 2022/0130985 | A1 | 4/2022 | Bothe et al. |
| 2022/0367106 | A1 | 11/2022 | Lee et al. |
| 2022/0376085 | A1 | 11/2022 | Bothe et al. |
| 2022/0376099 | A1 | 11/2022 | Bothe et al. |
| 2022/0376104 | A1 | 11/2022 | Bisges et al. |
| 2022/0376105 | A1 | 11/2022 | Guo et al. |

FOREIGN PATENT DOCUMENTS

| | | |
|---|---|---|
| JP | 2015165530 A | 9/2015 |
| JP | 2017022270 A | 1/2017 |
| JP | 6311668 B2 | 4/2018 |

OTHER PUBLICATIONS

Korean Office Action dated Dec. 10, 2024 for Korean Patent Application No. 10-2023-7042234, 5 pages.

Japanese Office Action dated Jan. 29, 2025 for Korean Patent Application No. 2023-571691, 3 pages.

Extended European Search Report for European Patent Application No. 22805538.0 mailed Mar. 19, 2025, 11 pages.

First Indian Office Action dated Nov. 10, 2025 for Indian Patent Application No. 202317083045, 8 pages.

\* cited by examiner

| In-situ SiN 52 |
| Barrier layer 22 |
| Channel layer 20 |
| Substrate 10 |

| Low SBH epitaxial layer<br>140 |
| --- |
| Barrier layer<br>122 |
| Channel layer<br>120 |
| Substrate<br>110 |

| Barrier layer<br>122 |
| --- |
| Channel layer<br>120 |
| Substrate<br>110 |

FIGURE 4C

Providing an epitaxial layer structure including a
channel layer and a barrier layer
802

Forming source and drain contacts on the barrier
layer
804

Forming a gate contact on the barrier layer
806

Forming a plurality of charge emission cap regions
on the barrier layer between the gate contact and
the drain contact
808

FIELD EFFECT TRANSISTOR WITH SELECTIVE MODIFIED ACCESS REGIONS

BACKGROUND

The present disclosure relates to transistor structures and in particular to high electron mobility transistors.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H-SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm². Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

FIG. 1A illustrates a conventional gallium nitride-based HEMT structure. The structure includes a substrate 10, which may be a semi-insulating 4H silicon carbide (SiC) substrate. Optional buffer, nucleation and/or transition layers (not shown) may be provided on the substrate 10. A channel layer 20 is provided on the substrate 10. The channel layer 20 may be a Group III-nitride, such as GaN. A barrier layer 22 is provided on the channel layer 20. The barrier layer 22 has a bandgap that is greater than the bandgap of the channel layer 20 and the channel layer 20 may have a larger electron affinity than the barrier layer 22. The barrier layer 22 may be AlN, AlInN, AlGaN or AlInGaN, and is thick enough and has a high enough Al composition and doping to induce a significant carrier concentration at the interface between the channel layer 20 and the barrier layer 22. This induced carrier concentration forms a two dimensional electron gas (2DEG) which provides a conductive channel in the device.

The conductivity of the 2DEG channel can be modulated by applying a voltage to a gate contact 32 formed on the barrier layer 22.

FIG. 1A also illustrates a cap layer 24 on the barrier layer 22 with the gate contact 32 in a recess 36 through the cap layer 24. The cap layer 24 moves the top (outer) surface of the device physically away from the channel, which may reduce surface effects of the device. The cap layer 24 may be blanket formed on the barrier layer 22 and may be epitaxially grown and/or formed by deposition. Typically, the cap layer 24 may have a thickness of from about 2 nm to about 500 nm.

As is further illustrated in FIG. 1A, ohmic source/drain contacts 30 are provided on the barrier layer 22, and a gate recess is provided through the cap layer 24 to expose a portion of the barrier layer 22. A gate contact 32 is formed in the recess and contacts the exposed portion of the barrier layer 22. The gate contact 32 may be a "T" gate as illustrated in FIG. 1A.

A passivation layer (not shown) may also be provided on the structure of FIG. 1A. For example, referring to FIG. 1B, a SiN layer 52 may be formed in situ over the surface of the device. The structure of FIG. 1B including the passivation layer may be annealed in a nitrogen environment to enhance process parameters.

Even with the presence of a cap layer 24 and annealing the structure, conventional HEMT structures may suffer from trapped charges in the barrier layer or channel layer of the device, which can cause distortion of signals passing through the device. For example, trapped charges can cause an output lag, which can undesirably reduce the switching speed, and therefore the bandwidth, of the device.

SUMMARY

A transistor device according to some embodiments includes a semiconductor epitaxial layer structure including a channel layer and a barrier layer on the channel layer, wherein the barrier layer has a higher bandgap than the channel layer, a source contact and a drain contact on the barrier layer, and a gate contact on the barrier layer between source contact and the drain contact. The device further includes a plurality of selective modified access regions at an upper surface of the barrier layer opposite the channel layer. The selective modified access regions include a material having a lower surface barrier height than the barrier layer, and the plurality of selective modified access regions are spaced apart on the barrier layer along a length of the gate contact.

The transistor device may further include a doped drain region in the barrier layer, wherein the drain contact contacts the drain region, and wherein the selective modified access regions are on the barrier layer between the gate contact and the drain region.

In some embodiments, the selective modified access regions include a region of increased conductivity at an upper surface of the barrier layer opposite the channel layer. The selective modified access regions include implanted regions may include implanted dopants at the upper surface of the barrier layer opposite the channel layer.

In some embodiments, the selective modified access regions have a thickness of about 0.1 nm to about 40 nm and a doping concentration of about 1E14 cm⁻³ to about 1E17 cm⁻³.

In some embodiments, the selective modified access regions include epitaxial semiconductor layers of a material having a lower bandgap than the barrier layer. The barrier layer may include AlGaN and the selective modified access regions include AlGaN with a lower concentration of Al than the barrier layer. In some embodiments, the barrier layer includes AlGaN and the selective modified access regions include GaN.

The selective modified access regions may be doped with n-type dopants.

In some embodiments, the selective modified access regions may have a thickness of about 0.1 nm to about 40 nm and a doping concentration of about 1E14 cm$^{-3}$ to about 1E17 cm$^{-3}$.

The selective modified access regions may provide a charge emission path that allows charge carriers present at an upper surface of the barrier layer opposite the channel layer to conduct toward the drain contact.

The gate contact may not contact the selective modified access regions.

In some embodiments, the selective modified access regions have a first width d1, and are spaced apart on the barrier layer along the length of the gate contact by a second width d2. The first width d1 may be between about 1 micron and 100 microns and the second width d2 may be between about 1 micron and 100 microns.

A method of forming a transistor device according to some embodiments includes providing a semiconductor epitaxial layer structure including a channel layer and a barrier layer on the channel layer, wherein the barrier layer has a higher bandgap than the channel layer, forming a source contact and a drain contact on the barrier layer, forming a gate contact on the barrier layer between source contact and the drain contact, and forming a plurality of selective modified access regions at an upper surface of the barrier layer opposite the channel layer. The selective modified access regions include a material having a lower surface barrier height than the barrier layer, and are spaced apart along a length of the gate contact.

In some embodiments, forming the selective modified access regions includes forming a mask on the barrier layer, the mask having a plurality of openings therein that expose respective portions of an upper surface of the barrier layer, and forming the selective modified access regions at the portions of the upper surface of the barrier layer exposed by the openings.

Forming the charge cap emission regions may include forming a sacrificial dielectric layer on the mask and the barrier layer, wherein the sacrificial dielectric layer extends into the openings and contacts the barrier layer at the portions of the upper surface of the barrier layer exposed by the openings, annealing the sacrificial dielectric layer and the barrier layer, and removing the sacrificial dielectric layer.

In some embodiments, the sacrificial dielectric layer includes SiN, SiOx, AlN, AlO, and/or HfO.

In some embodiments, forming the selective modified access regions includes selectively forming epitaxial layers on portions of the upper surface of the barrier layer exposed by the openings, wherein the epitaxial layers include a material having a lower bandgap than the barrier layer. The epitaxial layers may be doped with n-type dopants.

In some embodiments, forming the selective modified access regions includes implanting n-type dopants into portions of the upper surface of the barrier layer exposed by the openings.

The gate contact may or may not contact the selective modified access regions.

The method may further include forming a doped drain region in the barrier layer wherein the drain contact contacts the drain region, wherein the selective modified access regions contact the drain region.

The selective modified access regions may have a first width d1, and may be spaced apart on the barrier layer along the length of the gate contact by a second width d2. The first width d1 may be between about 1 micron and 100 microns and the second width d2 may be between about 1 micron and 100 microns.

BRIEF DESCRIPTION OF THE DRAWINGS

FIG. 4C is a band diagram that illustrates surface barrier height in a HEMT.

FIGS. 8A to 8F, 8G-1, 8G-2 and 8G-3 are cross-sectional views illustrating operations for forming HEMT device structures according to further embodiments.

DETAILED DESCRIPTION OF EMBODIMENTS

Figures 1A, 1B:
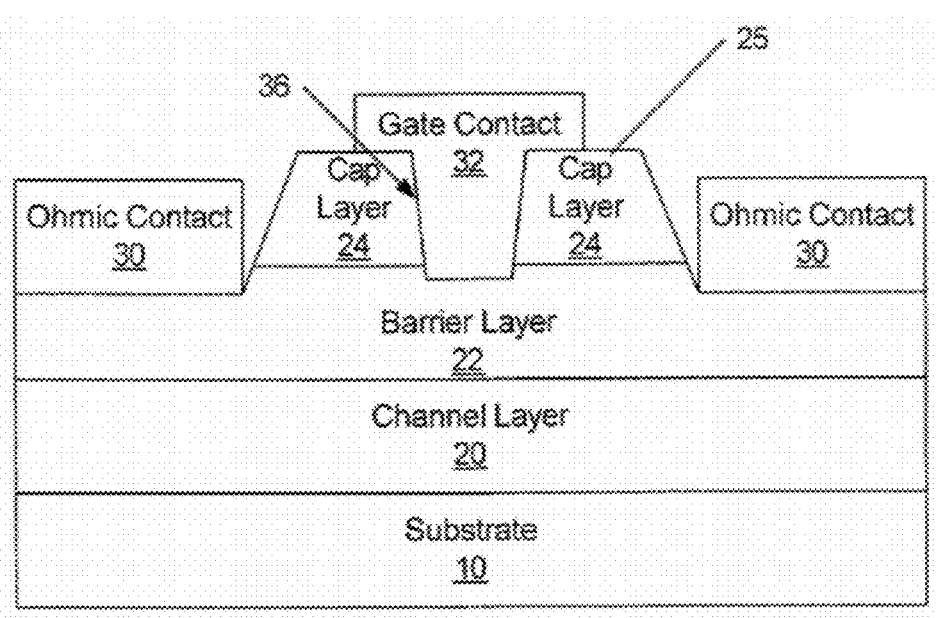
FIG. 1A is a cross-sectional view of a conventional transistor device including a field plate.
FIG. 1B is a cross-sectional view of an intermediate structure of a conventional transistor device.

Embodiments of the inventive concepts will now be described in connection with the accompanying drawings. Some embodiments described herein provide a transistor device including a field plate that is self-aligned the gate, and in some embodiments that is laterally spaced apart from the gate, such that the field plate does not overlap the gate in the vertical direction. In some embodiments, the field plate is recessed toward the barrier layer in a recess region. In still further embodiments, the field plate may be connected to the source outside an active area of the device by means of a connection that does not cross over the gate of the device.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Trapped charges in semiconductor devices, such as GaN HEMT devices, can cause non-linear distortion in output signals generated by the devices. To reduce such distortion, it is desirable to reduce the presence of trapped charges in the barrier layer of a HEMT device. Although not wishing to be bound by a particular theory, it is presently believed that charges may be injected into the barrier and/or channel layer of a HEMT device from the gate contact of the device, and that such charges may become trapped in the barrier layer, where they may adversely affect the switching characteristics of the device. Some embodiments provide a modified access region having a low surface barrier height (SBH) at or on the upper surface of the barrier layer that forms a charge emission path that allows some charges that would otherwise become injected into the barrier and/or channel layer to instead conduct along an upper surface of the barrier layer to the drain contact of the device. The modified access region comprises a material having a lower surface barrier height than the barrier layer of the HEMT relative to the gate contact. By reducing the number of charges that may become trapped in the barrier and/or channel layer, switching characteristics of the device may be improved.

Figure 2:
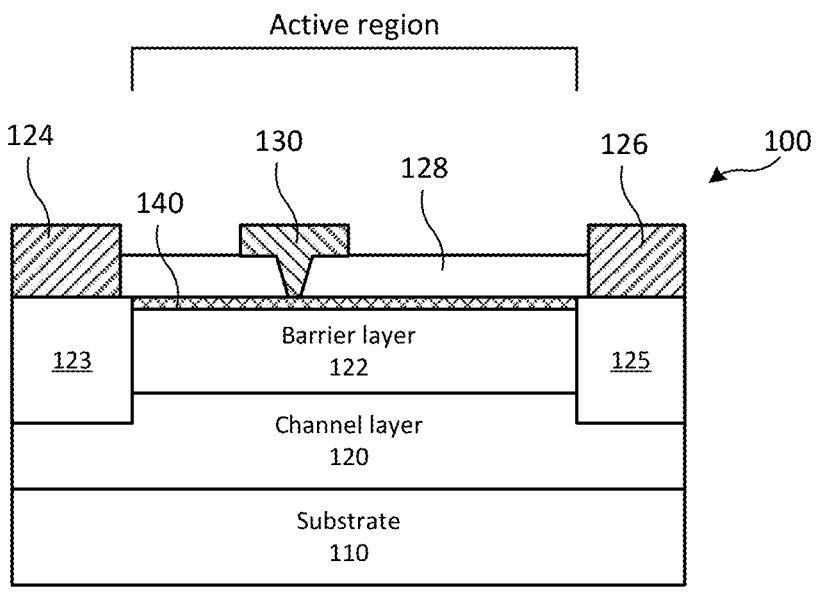
FIG. 2 is a schematic plan view of a HEMT device according to some embodiments.

A GaN HEMT structure 100 according to some embodiments is illustrated in FIG. 2. As shown therein, the structure includes a substrate 110 on which a channel layer 120 is formed. A barrier layer 122 is formed on the channel layer. Doped source and drain regions 123, 125 are formed in the barrier layer 122 and may extend into the channel layer 120, and source and drain ohmic contacts 124, 126 are formed on the source and drain regions 123, 125, respectively.

As further illustrated in FIG. 2, a modified access region 140 having a low surface barrier height (SBH) is formed on an upper surface of the barrier layer 122 opposite the channel layer 120 within an active region of the device between the source region 123 and the drain region 125. A gate contact 130 is formed on the modified access region 140.

Although not wishing to be bound by a particular theory, it is believed that the presence of the modified access region 140 provides a charge emission path that allows charges present at the surface of the barrier layer 122, such as charges that may have been injected from the gate contact 130, to flow to the drain region 125 instead of becoming trapped in the barrier layer 122 and/or channel layer 120 where they can affect the charge transfer characteristics of the device.

A passivation film 128, such as a dielectric film is formed on the structure, and a gate contact 130 is formed on the passivation film 128. The gate contact 130 extends through an opening in the passivation film 128 to contact the modified access region 140.

The substrate 110 may be a semi-insulating silicon carbide (SiC) substrate that may be, for example, 4H polytype of silicon carbide. Other silicon carbide candidate polytypes include the 3C, 6H, and 15R polytypes. In particular embodiments of the inventive concepts, the silicon carbide bulk crystal has a resistivity equal to or higher than about $1\times10^5\Omega$-cm at room temperature. Optional buffer, nucleation and/or transition layers (not shown) may be provided on the substrate 110. For example, an AlN buffer layer may be provided to provide an appropriate crystal structure transition between the silicon carbide substrate and the remainder of the device.

Although silicon carbide may be used as a substrate material, some embodiments may utilize any suitable substrate, such as sapphire, aluminum nitride, aluminum gallium nitride, gallium nitride, silicon, GaAs, LGO, ZnO, LAO, InP and the like.

Still referring to FIG. 2, the channel layer 120 may be deposited on the substrate 110 using buffer layers, transition layers, and/or nucleation layers as described above. Furthermore, the channel layer and/or buffer nucleation and/or transition layers may be deposited by MOCVD or by other techniques known to those of skill in the art, such as MBE or HVPE.

In some embodiments, the channel layer 120 is a Group III-nitride, such as AlxGa1-xN where 0≤x<1, provided that the energy of the conduction band edge of the channel layer 120 is less than the energy of the conduction band edge of the barrier layer 122 at the interface between the channel and barrier layers. In some embodiments, x=0, indicating that the channel layer 120 is GaN. The channel layer 120 may also be other Group III-nitrides such as InGaN, AlInGaN or the like. The channel layer 120 may be undoped ("unintentionally doped") and may be grown to a thickness of greater than about 20 Å. The channel layer 120 may also be a multi-layer structure, such as a superlattice or combinations of GaN, AlGaN or the like.

The channel layer 120 may have a bandgap that is less than the bandgap of the barrier layer 122 and the channel layer 120 may also have a larger electron affinity than the barrier layer 122. In some embodiments, the barrier layer 122 is AlN, AlInN, AlGaN or AlInGaN with a thickness of between about 0.1 nm and about 40 nm. In particular embodiments, the barrier layer 122 is thick enough and has a high enough Al composition and doping to induce a significant carrier concentration at the interface between the channel layer 120 and the barrier layer 122.

In some embodiments, the barrier layer 122 is AlGaN, AlInGaN and/or AlN or combinations of layers thereof. The barrier layer 122 may, for example, be from about 0.1 nm to about 40 nm thick, but is not so thick as to cause cracking or substantial defect formation therein. In some embodiments, the barrier layer 122 is undoped or doped with an n-type dopant to a concentration less than about $10^{19}$ cm$^{-3}$. In some embodiments of the inventive concepts, the barrier layer 122 is AlxGa1-xN where 0<x≤1. In particular embodiments, the aluminum concentration is about 25%. However, in other embodiments of the inventive concepts, the barrier layer 122 comprises AlGaN with an aluminum concentration of between about 5% and about 100%. In specific embodiments of the inventive concepts, the aluminum concentration is greater than about 10%.

The gate contact 130 may be a "T" gate as illustrated in FIG. 2 and may be fabricated using conventional fabrication techniques. The gate contact 130 may be fabricated using conventional fabrication techniques. Suitable gate materials may depend on the composition of the barrier layer. In some embodiments, conventional materials capable of making a Schottky contact to a nitride based semiconductor material may be used, such as Ni, Pt, NiSix, Cu, Pd, Cr, W and/or WSiN.

The passivation layer 128 may be a SiN layer. Optionally, the structure including the passivation layer may be annealed in a nitrogen environment at a temperature of 100° C. to 1200° C. to activate implanted dopants.

Figure 3A:
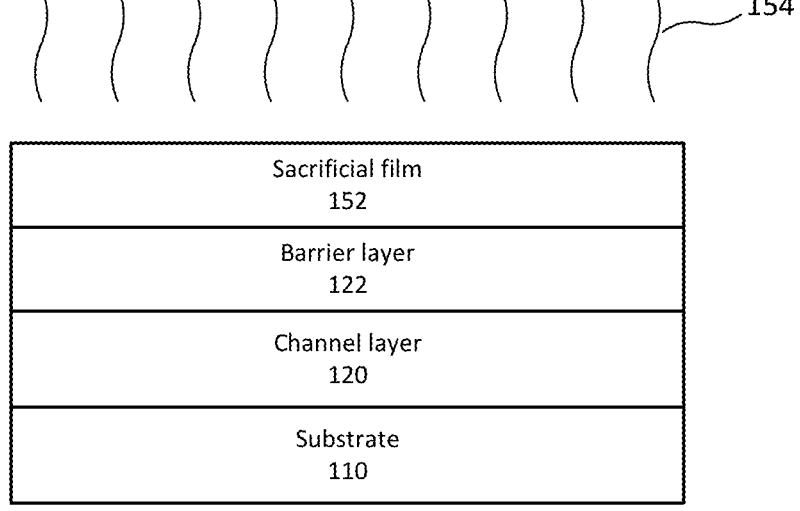
FIGS. 3A to 3D are cross-sectional views illustrating operations for forming HEMT device structures according to various embodiments.

The modified access region 140 may be formed in various ways. For example, some options for forming the modified access region 140 are illustrated in FIGS. 3A to 3D. Referring to FIG. 3A, in some embodiments, after formation of the barrier layer 122 on the channel layer 120, a sacrificial film 152 is formed on the barrier layer 122. The sacrificial film 152 may be a dielectric film having a different stoichiometry from the barrier layer 122. In particular embodiments, the sacrificial film 152 may include a dielectric material, such as SiN, SiOx, AlN, AlO, HfO, etc. The sacrificial film 152 may be doped or undoped, and may have a thickness of about 10 nm to about 200 nm.

With the sacrificial film 152 in place, the structure is annealed by exposing the structure to heat 154. The structure may be annealed at a temperature of about 100° C. to about 1200° C. for a time period of about 10 seconds to about 1 hour. The anneal may be carried out in an atmosphere such as nitrogen, argon or another inert gas.

During annealing, the modified access region 140 is formed at the surface of the barrier layer 122. The modified access region 140 may extend about 0.1 nm to about 40 nm into the barrier layer 122. In particular embodiments, the modified access region may extend about 0.5 nm to about 10 nm into the barrier layer 122.

The sacrificial film 152 is then stripped, for example using a HF etch or other stripping process, to clean the surface of the barrier layer 122, leaving the modified access region 140 in place. Remaining operations of device fabrication are then performed (e.g., formation of source/drain regions 123, 125, source/drain contacts 124, 126, passivation layer 128, gate 130 and other dielectric/metallization layers).

Figures 3B, 3C:
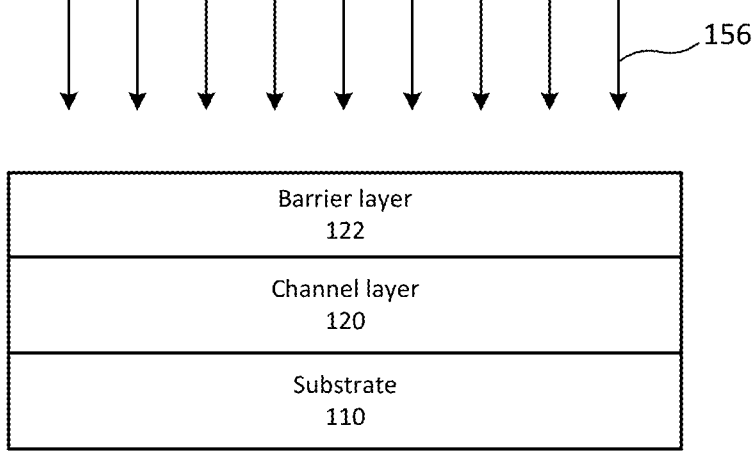
Figure 12:
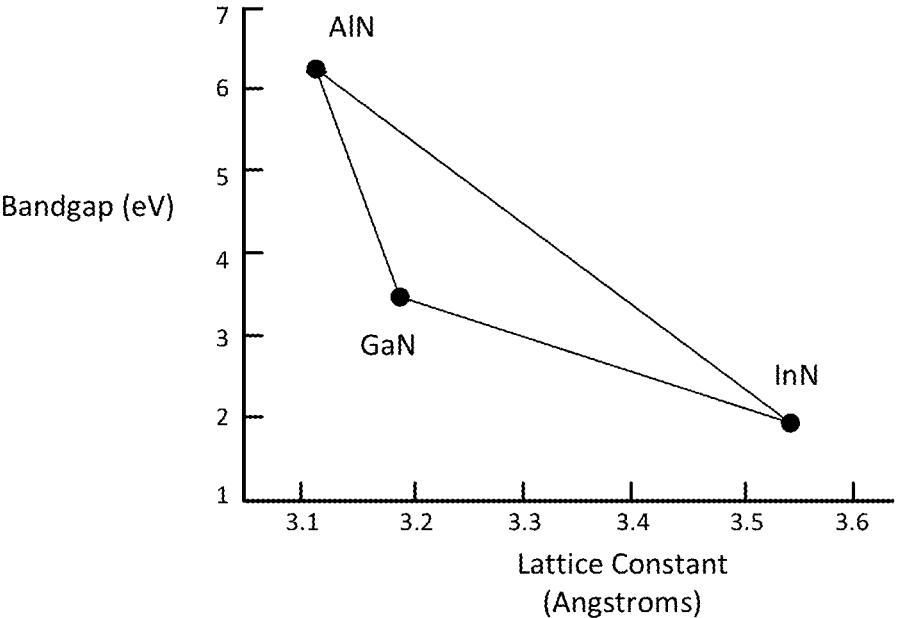
FIG. 12 is a schematic illustration of bandgap and lattice constant for InAlGaN material having various different compositions

Referring to FIG. 3B, the modified access region 140 may in some embodiments be formed as an epitaxial layer on the barrier layer 122. The modified access region 140 may be formed, for example, as a thin epitaxial layer of a Group III-nitride-based material having a lower bandgap than the barrier layer 122. In particular embodiments, the modified access region 140 may be formed as an epitaxial layer of InAlGaN having relative concentrations of In, Al and Ga that cause the modified access region 140 to have a lower bandgap than the barrier layer 122. The relationship between In, Al and Ga concentrations in an InAlGaN material and the bandgap of the material is illustrated, for example, in FIG. 12, which is a schematic illustration of bandgap and lattice constant for InAlGaN material having various different compositions (i.e., different relative levels of In, Al and Ga). As can be seen in FIG. 12, as the percentage of Al in the material increases, the bandgap of the material generally increases to a high of over 6 eV for AlN, while as the percentage of In in the material increases, the bandgap of the material decreases to a low of less than 2 eV for InN.

In some embodiments, the modified access region 140 may comprise GaN or InGaN. The modified access region 140 may have a thickness of about 0.1 nm to about 40 nm, and in some embodiments from about 0.5 nm to about 10 nm, and may be doped or undoped. In some embodiments, the modified access region 140 may comprise highly doped AlGaN (e.g., AlGaN doped with a doping concentration greater than about 1E14 cm$^{-3}$). In still further embodiments, the charge emission cap layer 140 may be doped with n-type dopants, such as silicon, at a doping concentration between about 1E14 cm$^{-3}$ and 1E17 cm$^{-3}$, and may have the same or similar bandgap as the barrier layer 122.

Referring to FIG. 3C, the modified access region 140 may be formed by implanting dopant ions 156 into the barrier layer 122. The modified access region 140 may be formed, for example, by implanting n-type dopants 156, such as silicon, into the surface of the barrier layer 122 to form a region of increased conductivity at the surface of the barrier layer 122. When formed as an implanted region in the barrier layer 122, the modified access region 140 may have a doping concentration of about 1E14 cm$^{-3}$ to about 1E17 cm$^{-3}$ and may have a thickness of about 0.1 nm to about 40 nm.

A suitable charge emission cap layer 140 may be formed in the barrier layer 122 by implanting silicon ions into the barrier layer 122 at an implant energy of about 10 keV to about 100 keV and a suitable dose to form a layer with a doping concentration of about 1E14 cm$^{-3}$ to about 1E17 cm$^{-3}$.

The presence of the modified access region 140 may increase switching speed in a transistor according to some embodiments. For example, FIG. 4A illustrates results of a test setup including a conventional GaN HEMT transistor and a GaN HEMT transistor including a modified access region 140 as described herein, while FIG. 4B compares Schottky barrier heights of conventional transistors with Schottky barrier heights of transistors including modified access regions 140 as described herein.

Figure 4A:
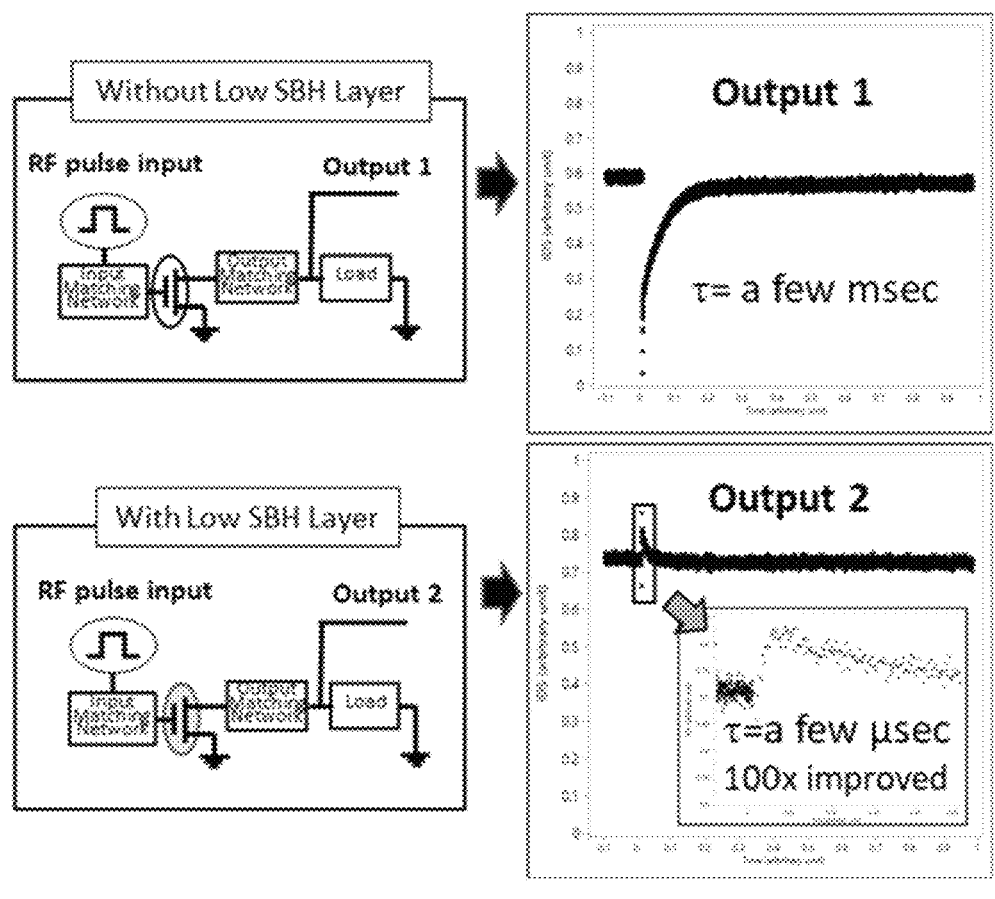
FIG. 4A illustrates results of a test setup including a conventional GaN HEMT and a GaN HEMT including a modified access region.

Referring to FIG. 4A, devices without (upper graph) and with (lower graph) the modified access region 140 were subjected to an RF pulse input. In particular the device transient behaviors were tested with a setup of input/output matching network circuits and a load under proper bias conditions and RF pulse input into the gate terminal of each device. The resulting output waveforms are shown on the right.

Devices without the modified access region 140 showed significant drain current drop (lag before recovery) at the beginning of applied RF pulse signal, which is believed to be influenced by the defect associated trapped charge. In particular, devices without the charge emission cap layer 140 exhibited a recovery time constant (τ) of several milliseconds, while devices with the charge emission cap layer 140 exhibited a significantly shorter recovery time constant (τ) of several microseconds. However, as can be seen in FIG. 4A, the devices with the modified access region 140 also exhibited some undesirable overshoot of the output signal.

Figure 4B:
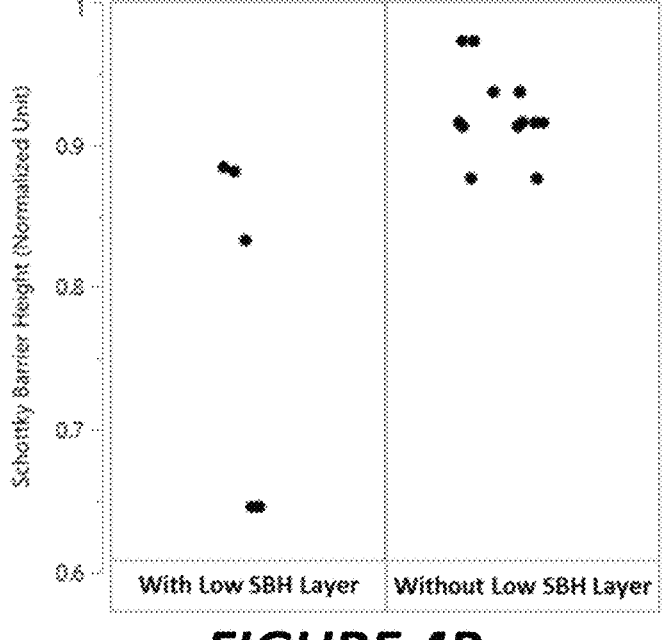
FIG. 4B is a chart that compares Schottky barrier heights of conventional transistors with Schottky barrier heights of transistors including charge emission cap layers.

Referring to FIG. 4B, devices with the modified access region 140 had lower average Schottky barrier heights than devices without the modified access region 140, which may be undesirable. For example, the reduced Schottky barrier height may be responsible for the overshoot evident in FIG. 4A.

Figure 4C:
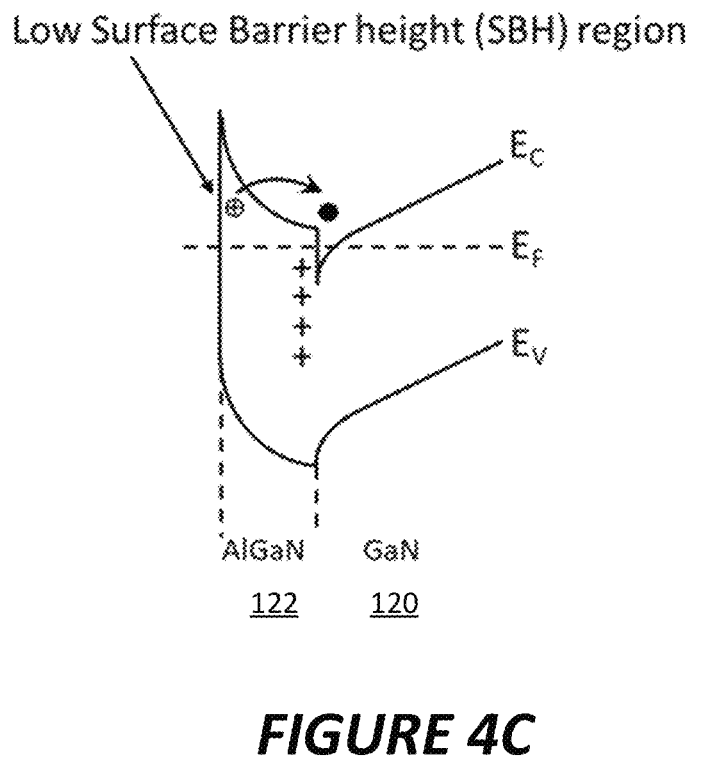
Figure 5A:
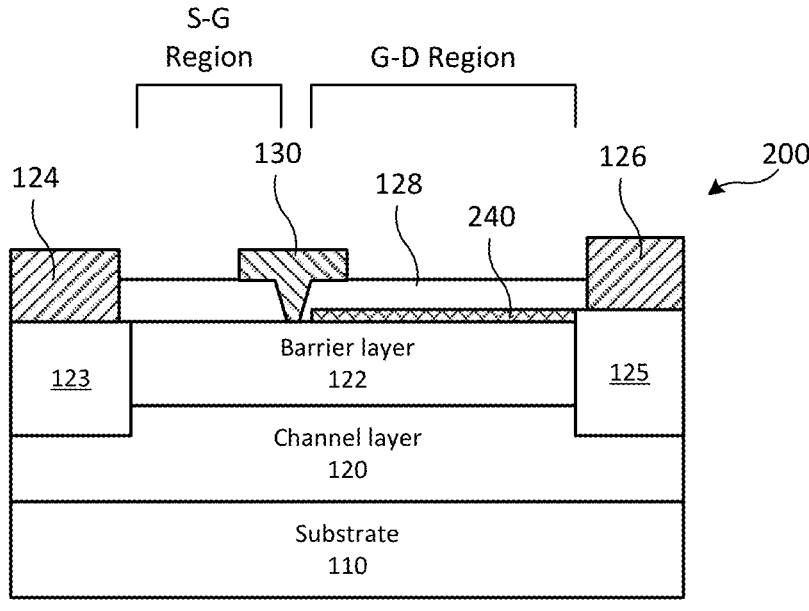
FIGS. 5A to 5D are cross-sectional views illustrating HEMT device structures in accordance with further embodiments.

FIG. 4C illustrates the surface barrier height of a HEMT device, which is the energy barrier between the Fermi level $E_F$ and the conduction band $E_C$ at the surface of the barrier layer 122. As can be seen in FIG. 4C, it is believed that lowering the surface barrier height of the device may allow carriers that would otherwise be trapped in the barrier layer 122 to move to the 2DEG region between the barrier layer 122 and the channel layer 120, where they can be conducted to the drain of the device. To overcome this effect, some embodiments provide a selective modified access region only in selective portions of the device active region between the source and drain regions 123, 125 of the device. In particular, some embodiments may overcome the disadvantages by localizing the charge emission path provided by the modified access region 140 to a region between the gate contact and the drain contact. Referring to FIG. 5A, a localized charge emission path is provided in a GaN HEMT device 200 by a selective modified access region 240 that is provided only in a region (labeled G-D region in FIG. 5A) between the gate contact 130 and the drain region 125. In particular embodiments, the selective modified access region 240 may not extend beneath the gate contact 130, so that the gate contact 130 directly contacts the barrier layer 122.

The selective modified access region selective modified access region 240 may have a reduced surface barrier height relative to a portion of the barrier layer 122 beneath the gate contact 130 and between the gate contact 130 and the source region 123. Selectively providing the selective modified access region 240 may improve the transient behavior of the device as well as the Schottky barrier height of the device. In some embodiments, the selective modified access region 240 may be formed by masking and selective epitaxial growth of the low SBH epitaxial layer 140 similar to the embodiments shown in FIG. 3B.

Figure 3D:
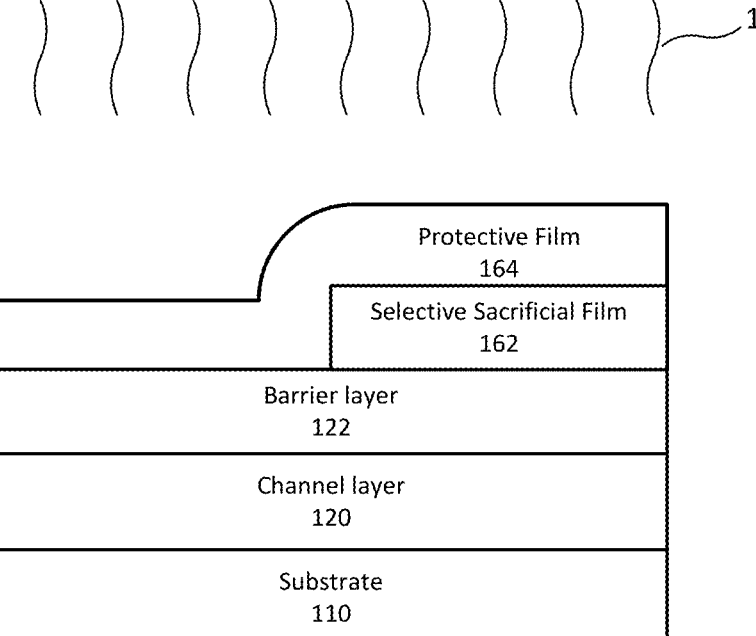
Figure 5B:
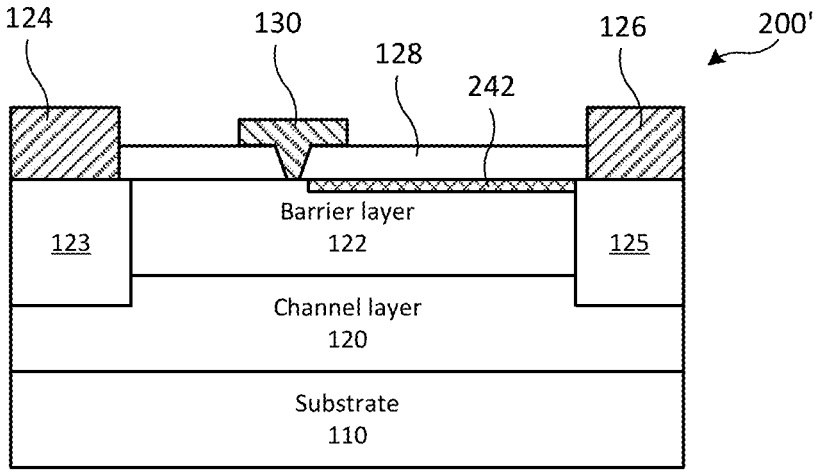

Referring to FIG. 5B, in some embodiments, a selective modified access region 242 may be provided in the barrier layer 122 between the gate contact 130 and the drain region 125. The selective modified access region 242 may be formed by selective formation of the selective sacrificial film 162 (as shown in FIG. 3D) prior to annealing, for example by masking and etching the sacrificial film 152 of FIG. 3A to form the selective sacrificial film 162 of FIG. 3D prior to annealing. A protective film 164 may be formed over the selective sacrificial film 162 prior to annealing. In further embodiments, referring to FIG. 3C, the selective modified access region 242 may be formed by masking and selective implantation of ions 156 into the barrier layer 122.

Figure 5C:
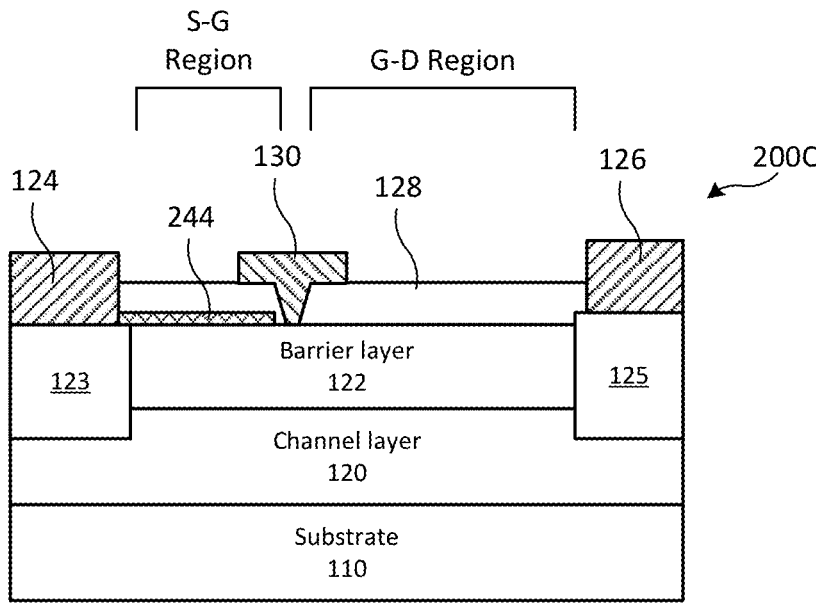

Referring to FIG. 5C, a GaN HEMT structure 200C according to further embodiments is illustrated. In the GaN HEMT structure 200C, a modified access region 244 having a reduced surface barrier height is provided only in the S-G region between the source region 123 and the gate contact 130 (but not beneath the gate contact 130). Accordingly, the device shown in FIG. 5C may have a reduced surface barrier height in a region between the source contact 124 and the gate contact 130 while maintaining a high Schottky barrier between the gate contact 130 and the barrier layer 122. Although not illustrated in FIG. 5C, it will be appreciated that the modified access region 244 may be formed as a surface region within the barrier layer 122 as described above with respect to FIG. 5B.

Figure 5D:
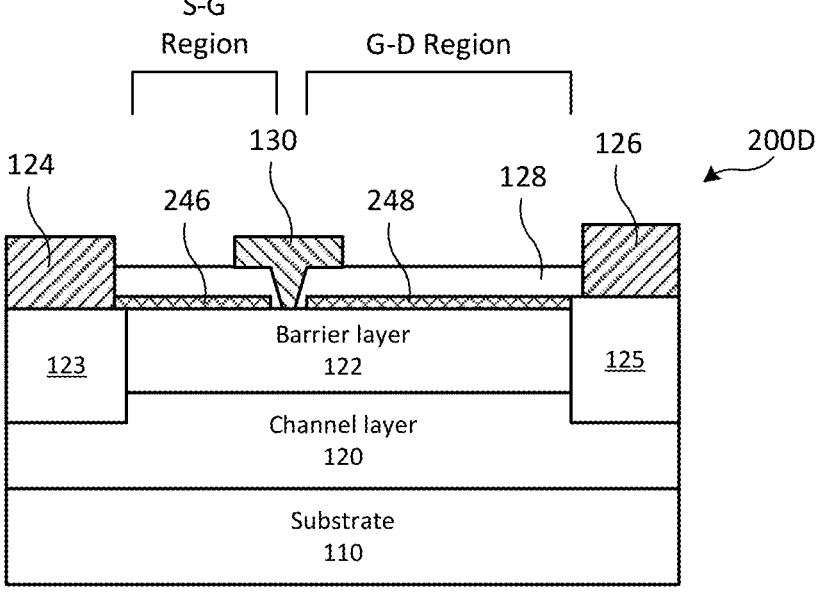

Referring to FIG. 5D, a GaN HEMT structure 200D according to further embodiments is illustrated. In the GaN HEMT structure 200C, a first modified access region 246 having a reduced surface barrier height is provided in the S-G region between the source region 123 and the gate contact 130 (but not beneath the gate contact 130), and a second modified access region 248 having a reduced surface barrier height is provided in the G-D region between the gate contact 130 and the drain region 125 (but not beneath the gate contact 130). Accordingly, the device shown in FIG. 5D may have a reduced surface barrier height in a region between the source contact 124 and the gate contact 130 and in a region between the gate contact 130 and the drain contact 126 while maintaining a high Schottky barrier between the gate contact 130 and the barrier layer 122. Although not illustrated in FIG. 5D, it will be appreciated that one or both of the first modified access region 246 and the second modified access region 248 may be formed as a surface region within the barrier layer 122 as described above with respect to FIG. 5B.

Figure 6A:
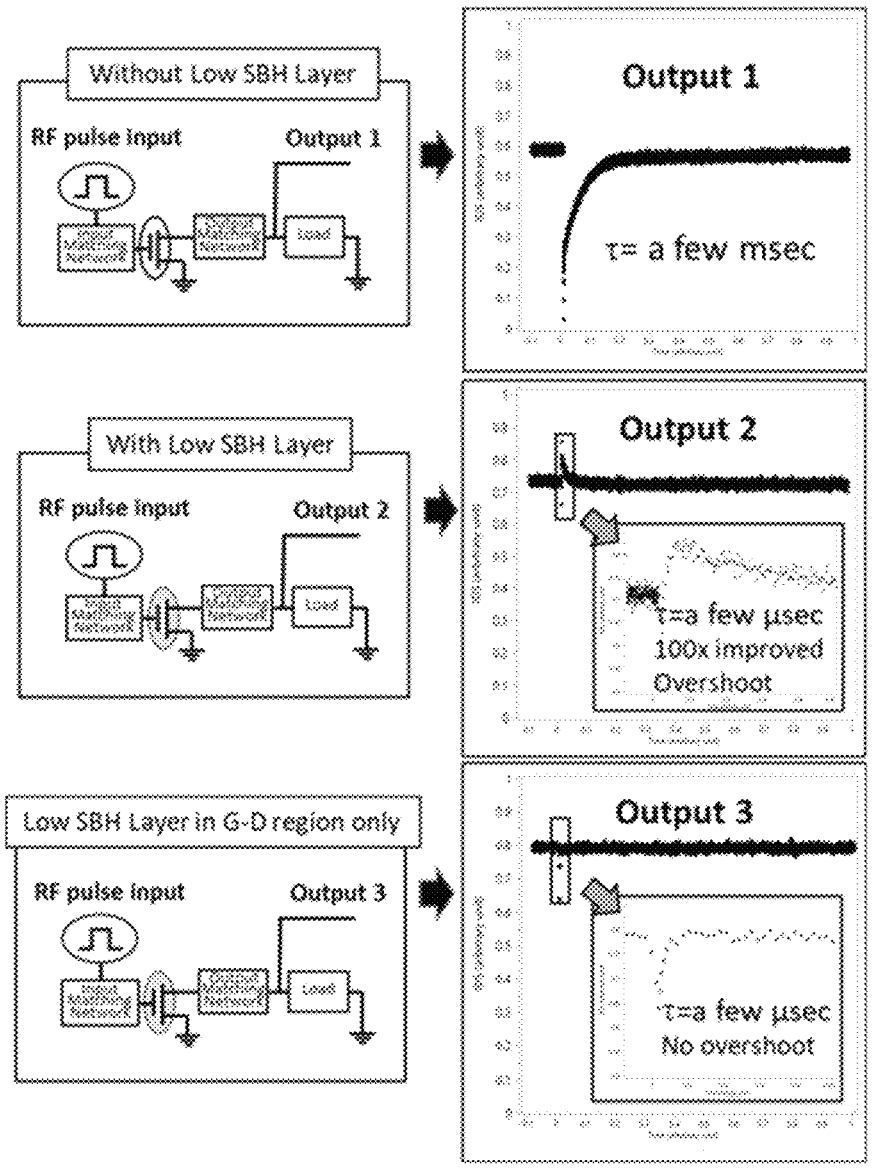
FIG. 6A illustrates results of a test setup including a conventional GaN HEMT and GaN HEMTs including selective modified access regions according to various embodiments.
Figure 6B:
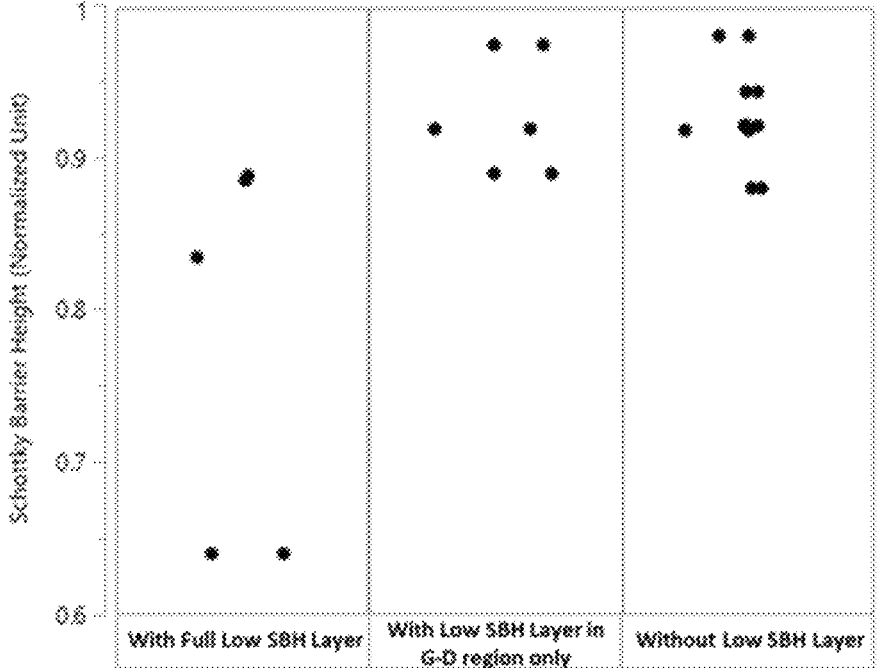
FIG. 6B is a chart that compares Schottky barrier heights of conventional transistors with Schottky barrier heights of transistors including selective modified access regions according to various embodiments.

The presence of the selective modified access region 240 or region 242 in the G-D region may increase switching speed in a transistor according to some embodiments without causing undesirable overshoot of the drain current. For example, FIG. 6A illustrates results of a test setup including a conventional GaN HEMT transistor, a GaN HEMT transistor including a modified access region 140 over the entire active region between the source and drain regions 123, 125, and a GaN HEMT transistor including a selective modified access region 240 only in the G-D region. FIG. 6B compares Schottky barrier heights of conventional transistors with Schottky barrier heights of transistors including modified access regions 140 and transistors including selective modified access regions 240 only in the G-D region as described herein.

Referring to FIG. 6A, devices without modified access regions (upper graph) and with full modified access regions 140 (middle graph) and selective modified access regions 240 (lower graph) were subjected to an RF pulse input. In particular the device transient behaviors were tested with a setup of input/output matching network circuits and a load under proper bias conditions and RF pulse input into the gate terminal of each device. The resulting output waveforms are shown on the right.

Devices with the partial selective modified access region 240 exhibited a recovery time constant (τ) of about a few microseconds, which is comparable to the performance of devices with full modified access regions 140. However, as can be seen in FIG. 6A, the devices with the partial selective modified access region 240 exhibited no apparent overshoot of the output signal. Additionally, referring to FIG. 6B, devices with a selective modified access region 240 had similar Schottky barrier heights as devices without a modified access region.

Figure 7A:
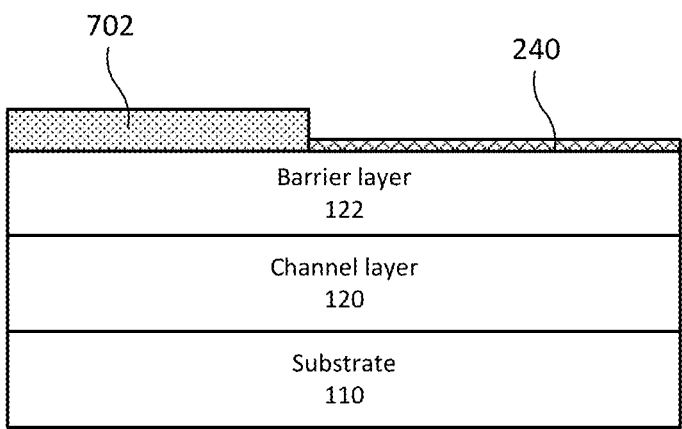
FIGS. 7A to 7D are cross-sectional views illustrating operations for forming HEMT device structures according to various embodiments.
Figure 7B:
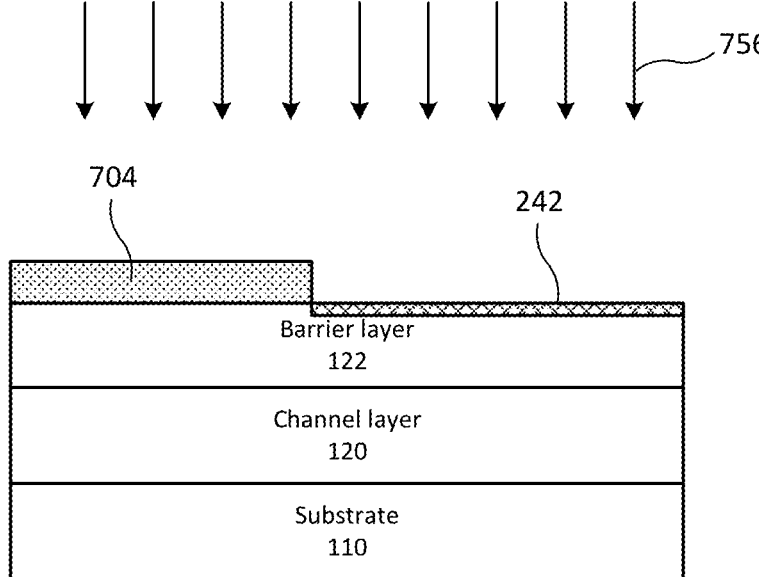
Figure 7C:
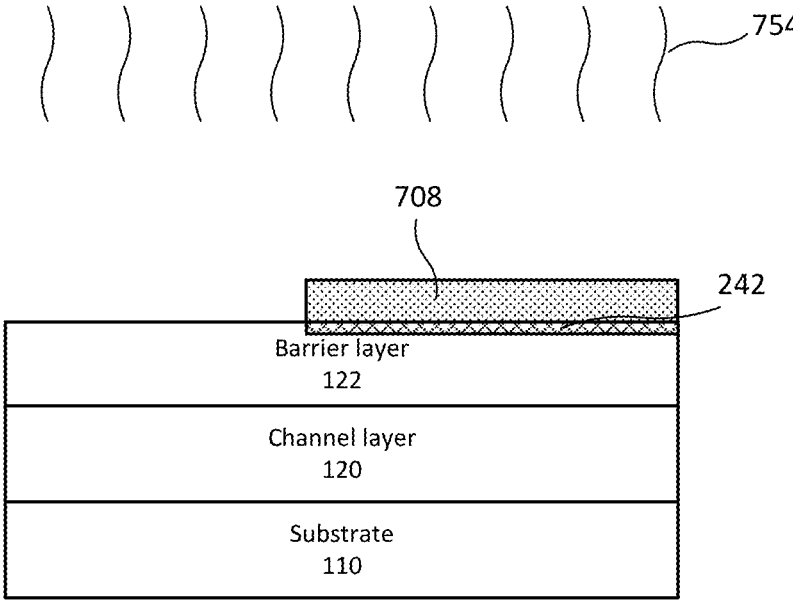
Figure 7D:
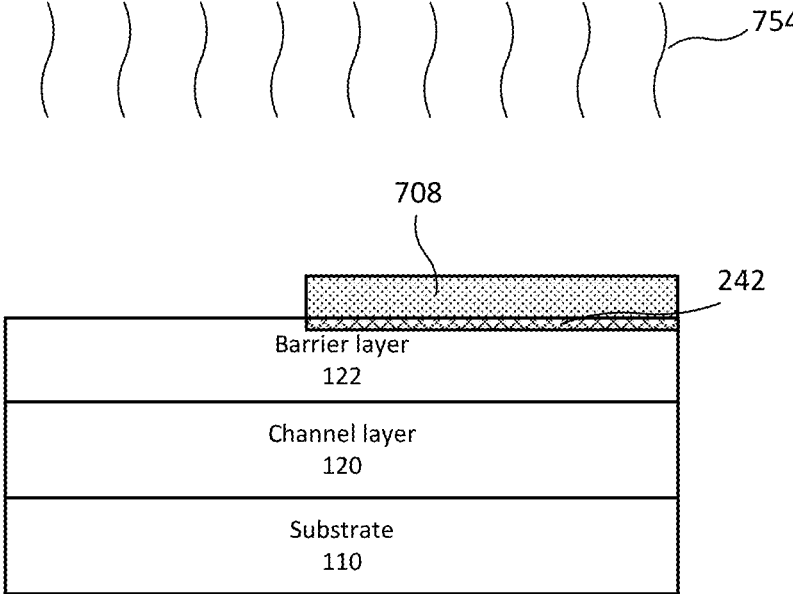

Selective formation of selective modified access regions 240, 242 is illustrated in FIGS. 7A to 7C. For example, referring to FIG. 7A, after formation of the channel layer 120 and the barrier layer 122 on the substrate 110, an epitaxial growth mask 702 may be selectively formed on an upper surface of the barrier layer 122 in a region corresponding to the S-G region of the device (FIG. 5A). The epitaxial growth mask 702 exposes a portion of the surface of the barrier layer corresponding to the G-D region of the device. An epitaxial layer is then selectively formed on the exposed portion of the barrier layer 122 to form the selective modified access region 240.

Referring to FIG. 7B, in some embodiments, an implant mask 704 is selectively formed on an upper surface of the barrier layer 122 in a region corresponding to the S-G region of the device. The implant mask 704 exposes a portion of the surface of the barrier layer corresponding to the G-D region of the device. Dopant ions 756 are then implanted into the exposed surface of the barrier layer 122 to form the selective modified access region 240.

Referring to FIG. 7C, in some embodiments, a sacrificial layer 708 is selectively formed on an upper surface of the barrier layer 122 in a region corresponding to the G-D region of the device. The implant mask 704 exposes a portion of the surface of the barrier layer corresponding to the S-G region of the device. The structure is then annealed 754 to form the selective modified access region 242. A surface protection layer (not shown) may be formed over the sacrificial layer before annealing to prevent surface desorption of the barrier layer during the anneal. The sacrificial layer is then removed, for example, via etching.

In some embodiments, the selective modified access region 240 may not fill the entire G-D region between the gate contact 130 and the drain region 125. For example, a plurality of modified access regions may be formed on the upper surface of the barrier layer 122, and may be spaced apart along the length of the gate. The use of multiple modified access regions may provide a mechanism to control the conductivity of the charge emission from the surface of the barrier layer 122 to the drain region 125 through the dimensioning and placement of the regions.

For example, FIGS. 8A to 8F illustrate operations for forming HEMT devices according to various embodiments. FIGS. 8A to 8F illustrate operations for forming a modified access region in a G-D region of a HEMT device structure. However, it will be appreciated that similar operations may be performed to form a modified access region in an S-G region as illustrated in FIG. 5C or in both an S-G region and a G-D region of a HEMT device structure as illustrated in FIG. 5D.

Figure 8A:
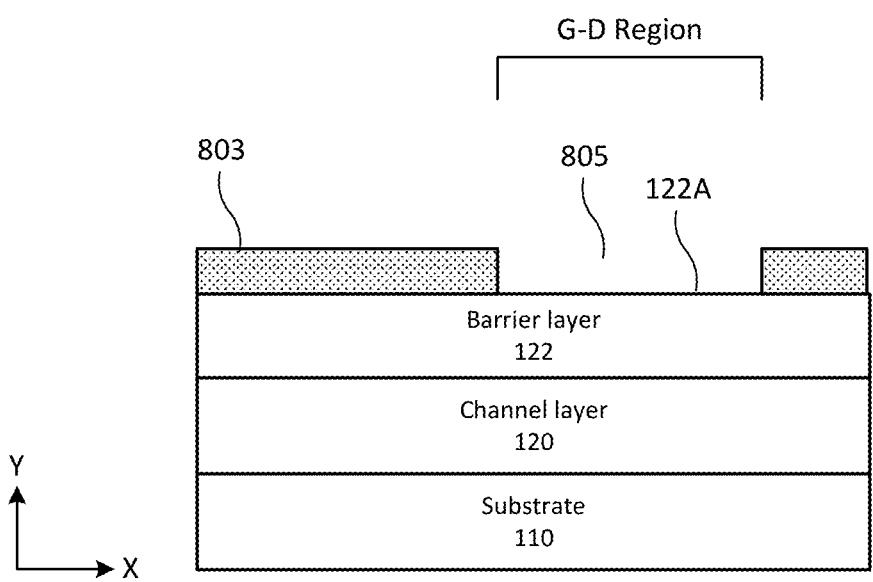
Figure 8B:
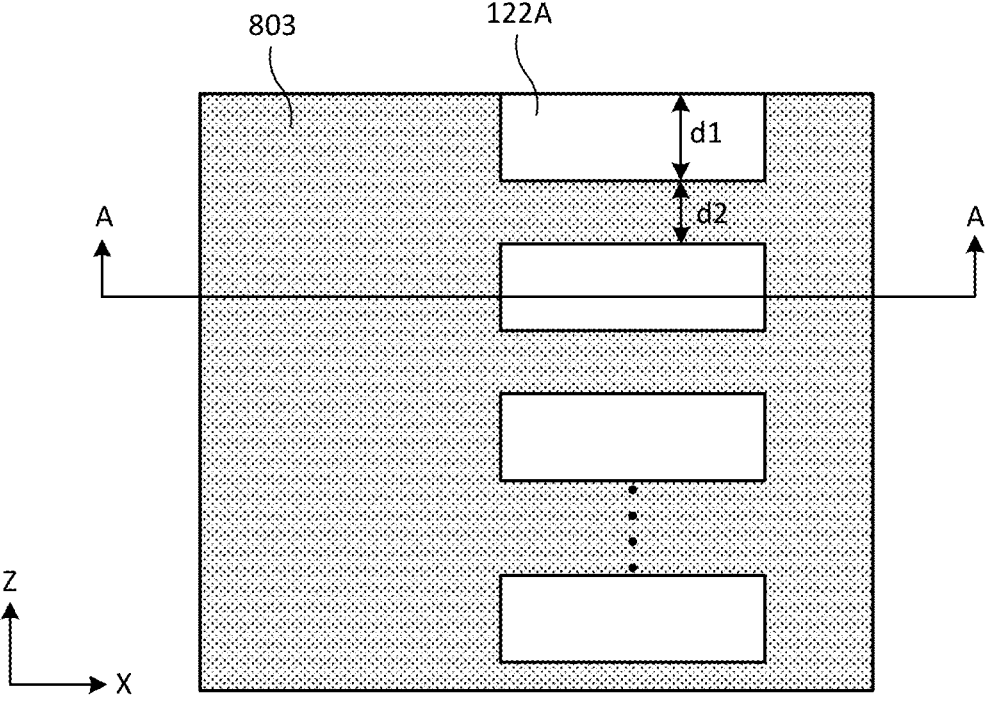

FIG. 8A is a cross-sectional view of a precursor structure of a GaN HEMT device including a substrate 110, a channel layer 120 and a barrier layer 122 taken along line A-A of FIG. 8B, which is a plan view of the structure of FIG. 8A. A mask 803 is formed on the upper surface of the barrier layer 122 to expose a plurality of regions 122A of the surface of the barrier layer 122. The regions 122A extend across the G-D region of the precursor structure. The regions 122A have respective widths d1 and d2 that may be from 1 micron to 100 microns. The number of regions 122A may depend on the values of d1 and d2 along with the overall gate width of the device. Although illustrated as rectangles in FIG. 8B, it will be appreciated that the regions 122A could have any desired shape.

Figure 8C:
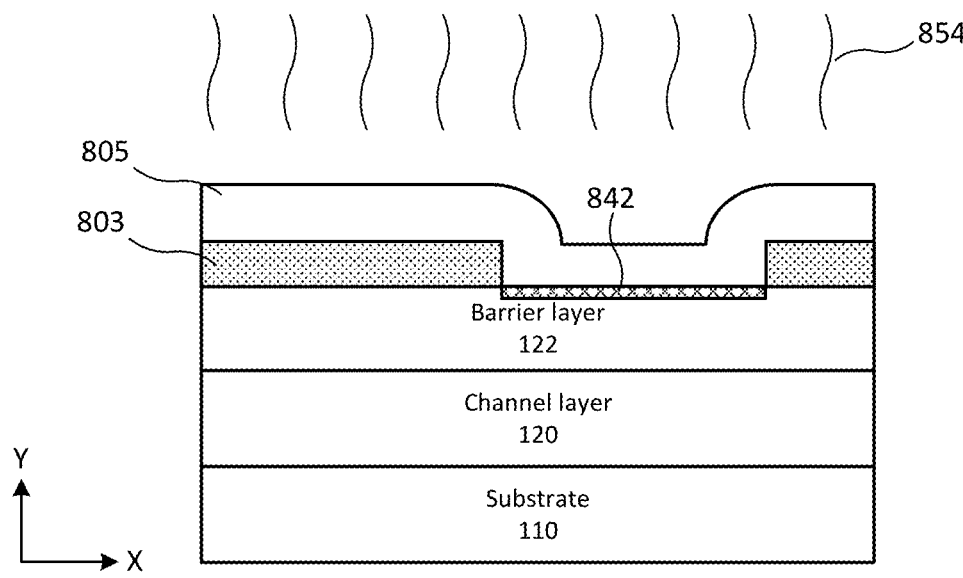
Figure 8D:
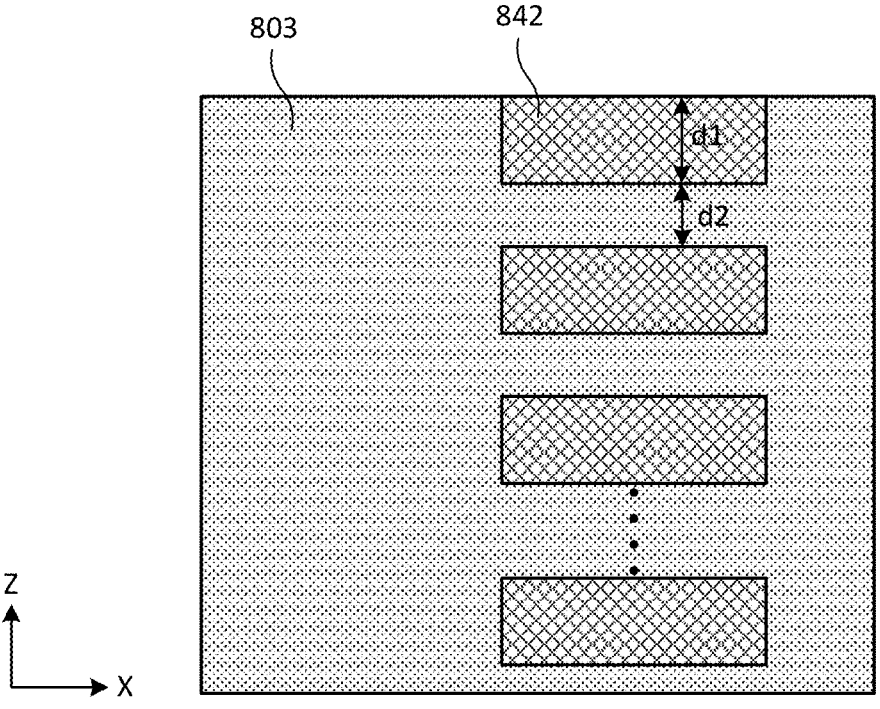

Referring to FIGS. 8C and 8D, a sacrificial film 805 is formed over the mask layer and onto the barrier layer in the regions 122A. The sacrificial film 805 may have a composition similar to that of the sacrificial film 152 described above in connection with FIG. 3A. The structure is then annealed 854 in a similar manner as described above in connection with FIG. 3A to form a plurality of regions 842 in the exposed regions 122A at the surface of the barrier layer 122.

Figure 8E:
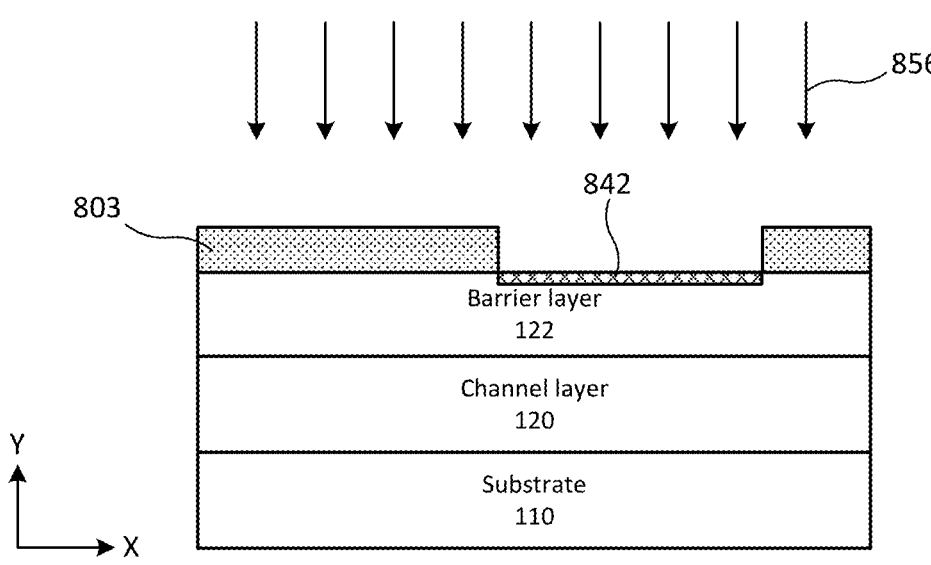

Referring to FIG. 8E, in some embodiments, the regions 842 can be formed by implanting ions 856 into the exposed regions 122A at the surface of the barrier layer 122.

Figure 8F:
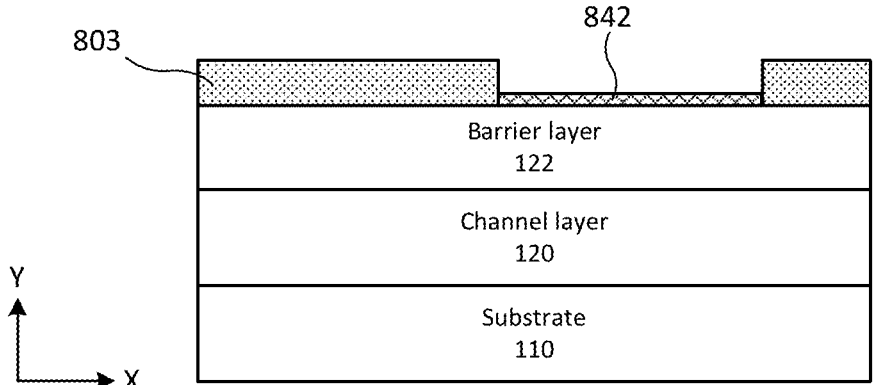

Referring to FIG. 8F, in some embodiments, the regions 842 can be formed by selective epitaxial growth on the barrier layer within the exposed regions 122A.

Figures 1, 8G:
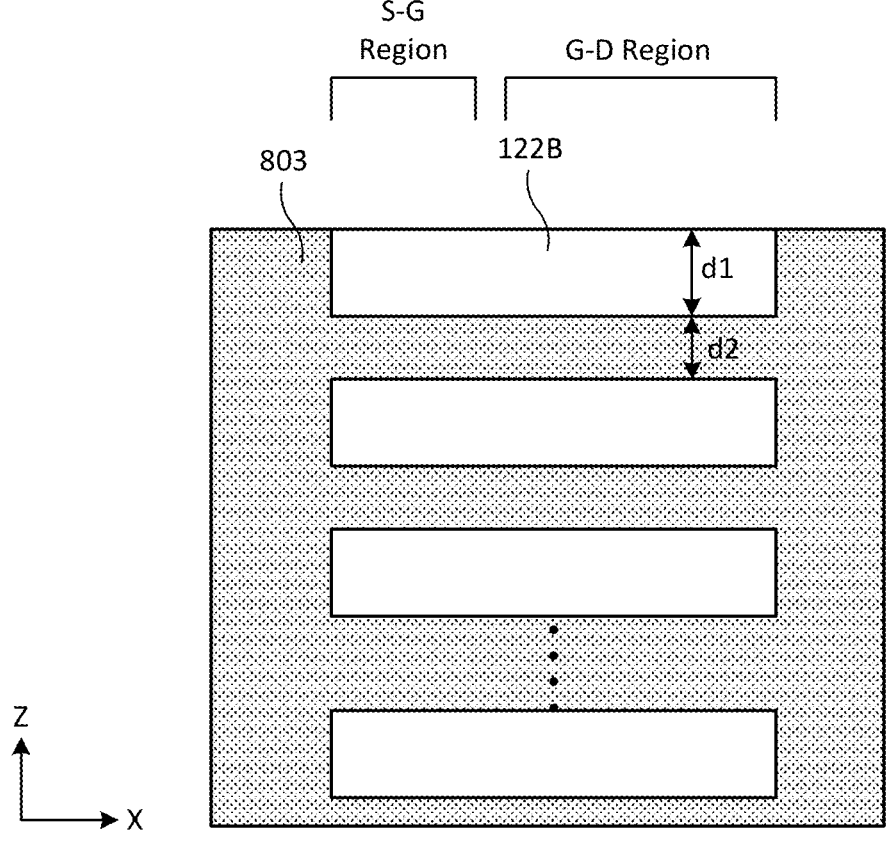
Figures 2, 8G:
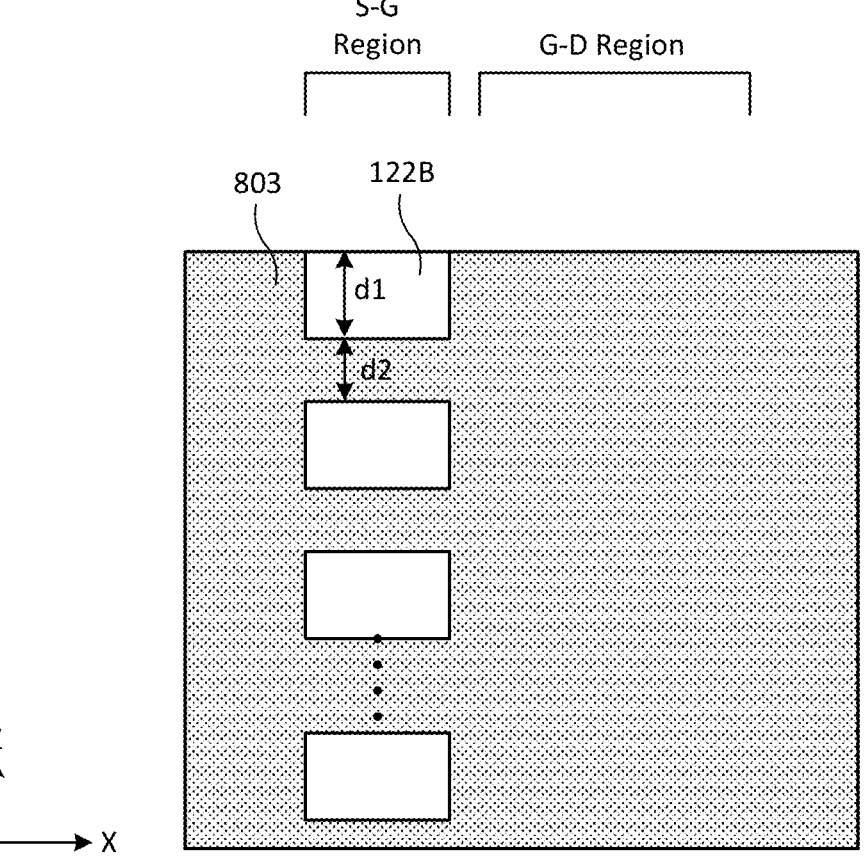

Referring to FIG. 8G-1, in some embodiments, regions 122B can be formed to cover the entire length between the source and drain contacts, so that the selective modified access regions 842 are formed in the S-G region as well as the G-D region of the device.

Referring to FIG. 8G-2, in some embodiments, regions 122B can be formed to between the source and gate contacts, so that the selective modified access regions 842 are formed in the S-G region of the device.

Figures 3, 8G:
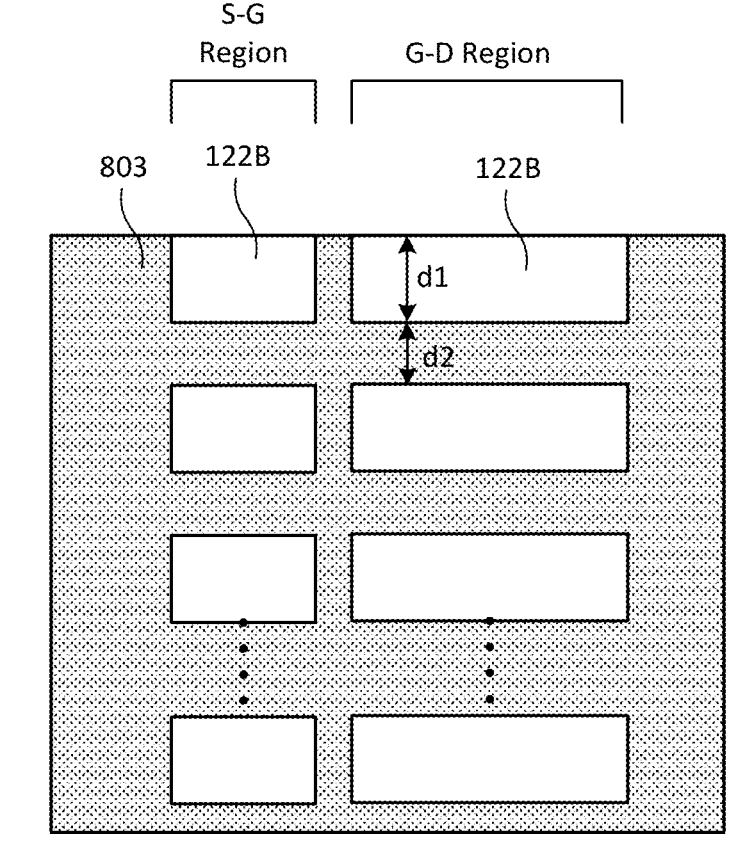

Referring to FIG. 8G-3, in some embodiments, regions 122B can be formed between the source and drain contacts but not beneath the gate contact, so that the selective modified access regions 842 are formed in the S-G region and the G-D region of the device but not beneath the gate contact.

Figure 8H:
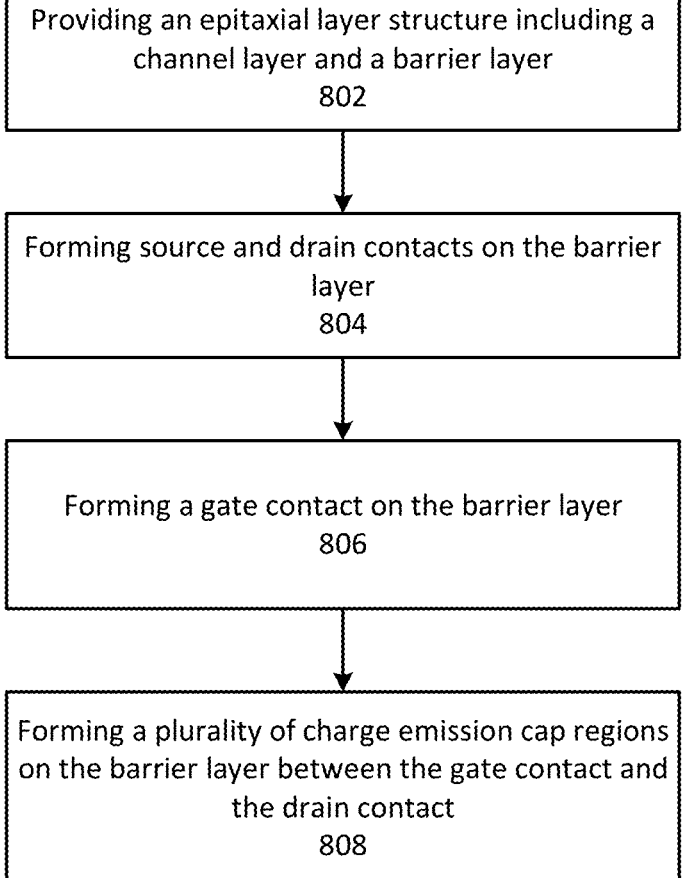
FIG. 8H is a block diagram illustrating operations of forming a transistor device according to some embodiments.

FIG. 8H illustrates a method of forming a transistor device. The method includes providing a semiconductor epitaxial layer structure including a channel layer and a barrier layer on the channel layer, wherein the barrier layer has a higher bandgap than the channel layer (block 802). The method further includes forming a source contact and a drain contact on the barrier layer (block 804), and forming a gate contact on the barrier layer between source contact and the drain contact (block 806). The method further includes forming a plurality of selective modified access regions at an upper surface of the barrier layer opposite the channel layer (block 808). The selective modified access regions include a material having a lower surface barrier height relative to the gate contact than the barrier layer, and the plurality of charge emission cap regions are spaced apart along a length of the gate contact.

Forming the selective modified access regions may include forming a mask on the barrier layer, the mask having a plurality of openings therein that expose respective portions of an upper surface of the barrier layer, and forming the selective modified access regions at the portions of the upper surface of the barrier layer exposed by the openings.

Forming the selective modified access regions may include forming a sacrificial dielectric layer on the mask and the barrier layer, wherein the sacrificial dielectric layer extends into the openings and contacts the barrier layer at the portions of the upper surface of the barrier layer exposed by the openings, annealing the sacrificial dielectric layer and the barrier layer, and removing the sacrificial dielectric layer. The sacrificial dielectric layer may include SiN, SiOx, AlN, AlO, and/or HfO.

In some embodiments, forming the selective modified access regions may include selectively forming epitaxial layers on portions of the upper surface of the barrier layer exposed by the openings, wherein the epitaxial layers include a material having a lower bandgap than the barrier layer. The epitaxial layers may be doped with n-type dopants.

In some embodiments forming the selective modified access regions includes implanting n-type dopants into portions of the upper surface of the barrier layer exposed by the openings.

In some embodiments, the gate contact forms a non-ohmic contact to the barrier layer and does not contact the charge emission cap regions.

The method may further include forming a doped drain region in the barrier layer wherein the drain contact contacts the drain region, wherein the charge emission cap regions contact the drain region.

The selective modified access regions may have a first width d1, and may be spaced apart on the barrier layer along the length of the gate contact by a second width d2.

The first width d1 may be between about 1 micron and 100 microns and the second width d2 may be between about 1 micron and 100 microns.

Transistor devices including selective modified access regions as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 9A-9C.

Figure 9A:
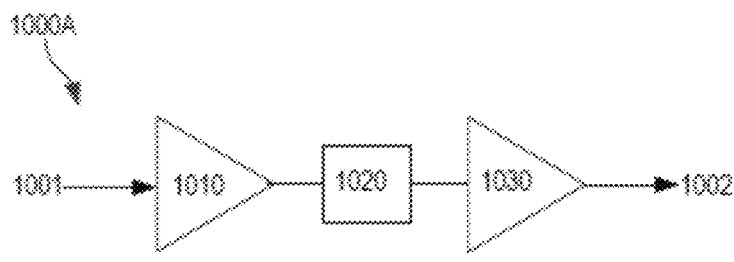
FIGS. 9A-9C are schematic block diagrams of multi-amplifier circuits in which RF transistor amplifiers incorporating transistor devices according to embodiments may be used.

Referring to FIG. 9A, an RF transistor amplifier 1000A is schematically illustrated that includes a pre-amplifier 1010 and a main amplifier 1030 that are electrically connected in series. As shown in FIG. 9A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 9A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 9B:
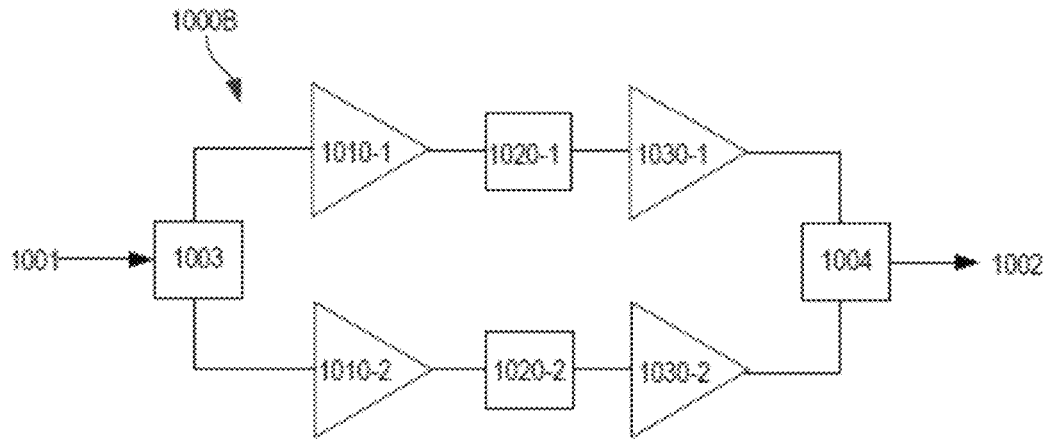

Referring to FIG. 9B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 9C:
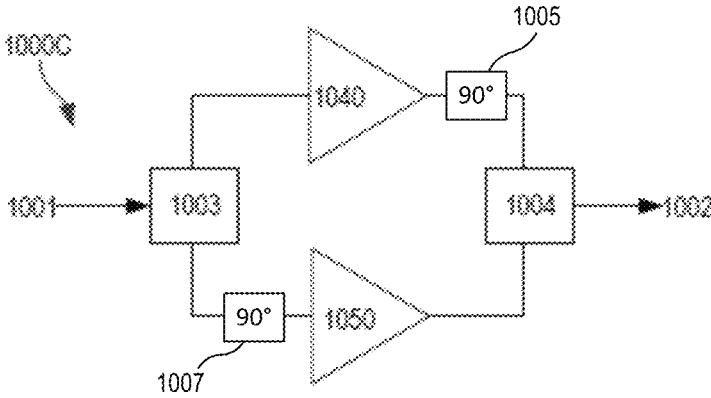

As shown in FIG. 9C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 10:
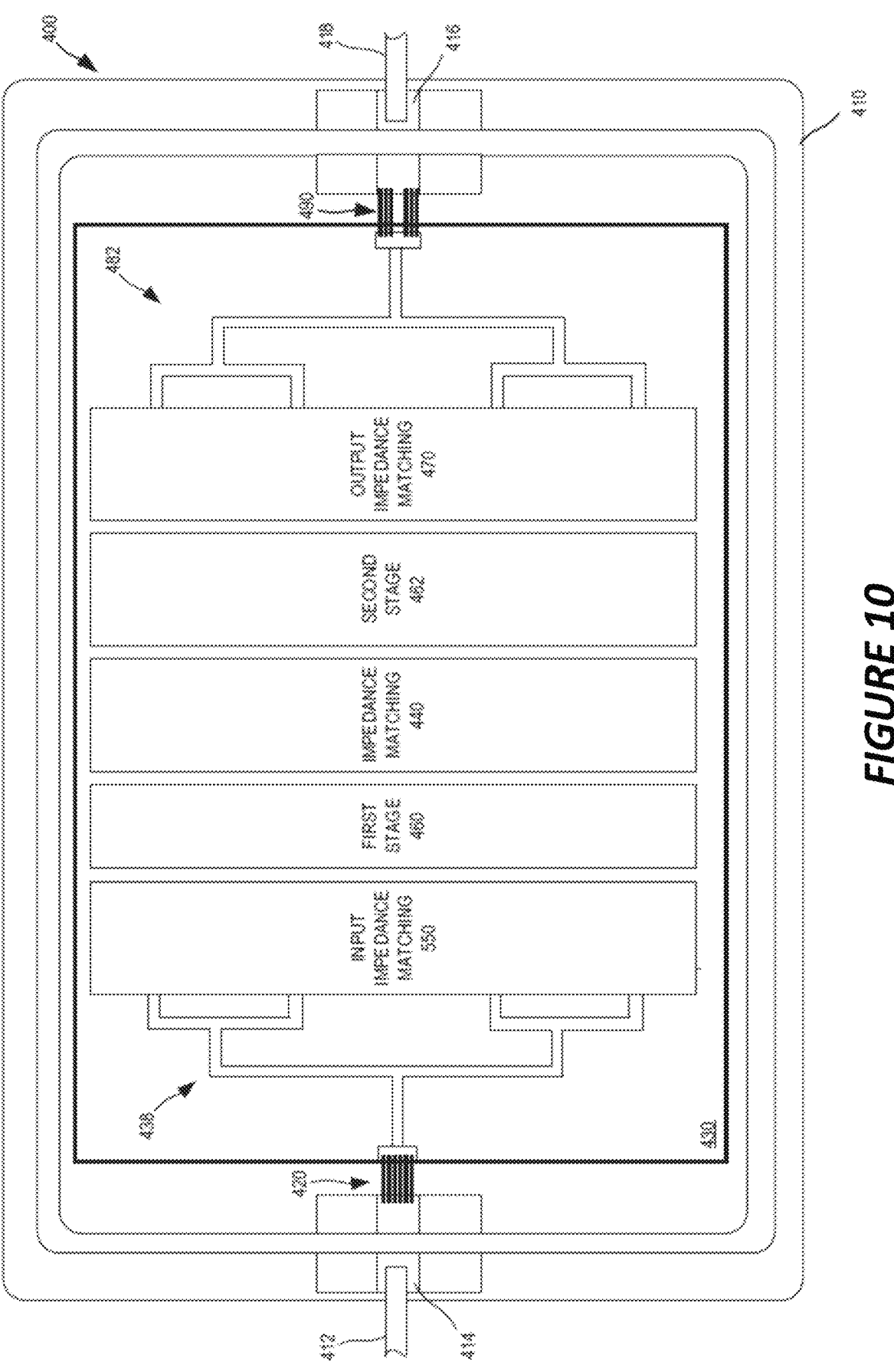
FIG. 10 is a schematic illustration of a MMIC amplifier including a HEMT transistor according to some embodiments.

FIG. 10 is a plan view of a MMIC RF transistor amplifier 400 according to embodiments of the present inventive concepts. As shown in FIG. 10, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 11A:
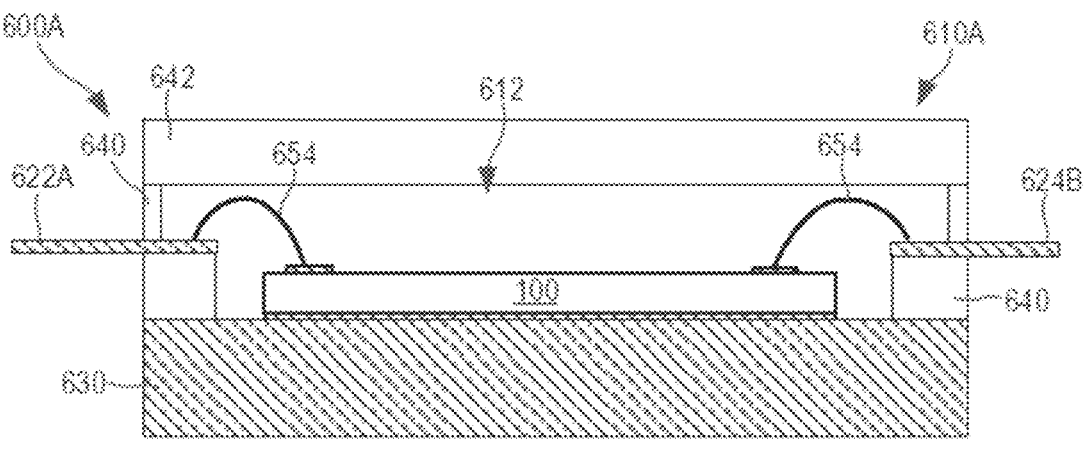
FIGS. 11A and 11B are schematic cross-sectional views illustrating example packages for RF transistor amplifier dies according to some embodiments.
Figure 11B:
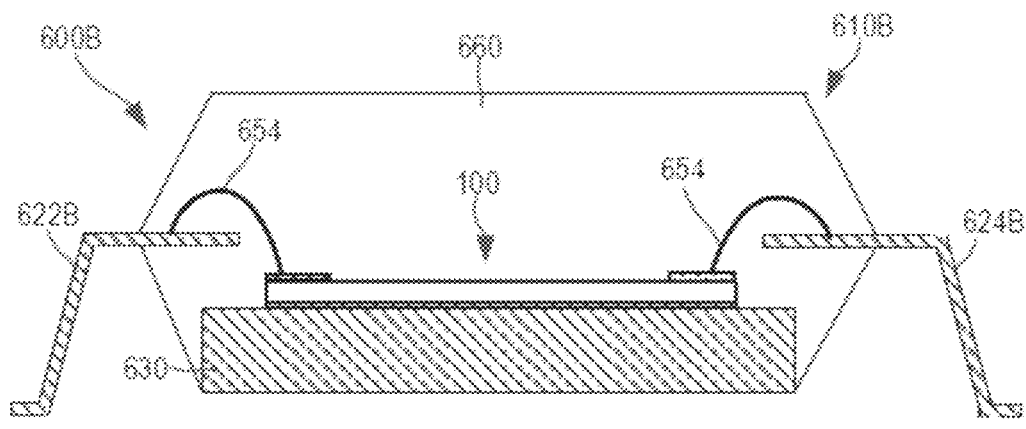

FIGS. 11A and 11B are schematic cross-sectional views illustrating several example ways that that the RF transistor amplifier dies according to embodiments of the present inventive concepts may be packaged to provide packaged RF transistor amplifiers 600A and 600B, respectively.

FIG. 11A is a schematic side view of a packaged Group III nitride-based RF transistor amplifier 600A. As shown in FIG. 11A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors. This heat may be transferred though the source vias 146 and the semiconductor layer structure of the device to the source terminal and then to the metal submount 630.

FIG. 11B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication"; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

What is claimed is:

1. A transistor device, comprising:
a semiconductor epitaxial layer structure including a channel layer and a barrier layer on the channel layer, wherein the barrier layer has a higher bandgap than the channel layer; and
a transistor unit cell in the semiconductor epitaxial layer structure, the transistor unit cell comprising:
a source contact and a drain contact on the barrier layer wherein the source contact and the drain contact are spaced apart in a first direction;
a gate contact on the barrier layer between the source contact and the drain contact; and
a plurality of selective modified access regions at an upper surface of the barrier layer opposite the channel layer within the transistor unit cell between the source contact and the drain contact, wherein the selective modified access regions comprise a material having a lower surface barrier height than the barrier layer, and wherein the plurality of selective modified access regions are entirely spaced apart on the barrier layer along a width of the gate contact in a second direction that is perpendicular to the first direction, wherein the gate contact does not extend through the barrier layer or one or more of the plurality of selective modified access regions.

2. The transistor device of claim 1, further comprising:
a doped drain region in the barrier layer, wherein the drain contact contacts the drain region;
wherein the selective modified access regions are on the barrier layer between the gate contact and the drain region.

3. The transistor device of claim 1, wherein the selective modified access regions comprise a region of increased conductivity at an upper surface of the barrier layer opposite the channel layer.

4. The transistor device of claim 3, wherein the selective modified access regions comprise implanted regions comprising implanted dopants at the upper surface of the barrier layer opposite the channel layer.

5. The transistor device of claim 3, wherein the selective modified access regions have a thickness of about 0.1 nm to about 40 nm and a doping concentration of about $1E14$ cm$^{-3}$ to about $1E17$ cm$^{-3}$.

6. The transistor device of claim 1, wherein the selective modified access regions comprise epitaxial semiconductor layers of a material having a lower bandgap than the barrier layer.

7. The transistor device of claim 6, wherein the barrier layer comprises AlGaN and the selective modified access regions comprise AlGaN with a lower concentration of Al than the barrier layer.

8. The transistor device of claim 6, wherein the barrier layer comprises AlGaN and the selective modified access regions comprise GaN.

9. The transistor device of claim 6, wherein the selective modified access regions are doped with n-type dopants.

10. The transistor device of claim 6, wherein the selective modified access regions have a thickness of about 0.1 nm to about 40 nm and a doping concentration of about $1E14$ cm$^{-3}$ to about $1E17$ cm$^{-3}$.

11. The transistor device of claim 1, wherein the selective modified access regions provide a charge emission path that allows charge carriers present at an upper surface of the barrier layer opposite the channel layer to conduct toward the drain contact.

12. The transistor device of claim 1, wherein the gate contact does not contact the selective modified access regions.

13. The transistor device of claim 1, wherein the selective modified access regions have a first width d1, and are spaced apart on the barrier layer along the width of the gate contact by a second width d2.

14. The transistor device of claim 13, wherein the first width d1 is between about 1 micron and 100 microns and the second width d2 is between about 1 micron and 100 microns.

15. The transistor device of claim 1,
wherein the selective modified access regions are on the barrier layer between the gate contact and the source contact.

16. The transistor device of claim 1,
wherein the selective modified access regions are on the barrier layer between the gate contact and the source contact and between the gate contact and the drain contact.

17. A method of forming a transistor device, comprising:
providing a semiconductor epitaxial layer structure including a channel layer and a barrier layer on the channel layer, wherein the barrier layer has a higher bandgap than the channel layer; and forming a transistor unit cell in the semiconductor epi-
taxial layer structure, wherein forming the transistor
unit cell comprises:

forming a source contact and a drain contact on the barrier
layer, wherein the source contact and the drain contact
are spaced apart in a first direction;

forming a gate contact on the barrier layer between the
source contact and the drain contact; and forming a plurality of selective modified access regions
within the transistor unit cell at an upper surface of the
barrier layer opposite the channel layer within the
transistor unit cell between the source contact and the
drain contact, wherein the selective modified access
regions comprise a material having a lower surface
barrier height than the barrier layer, and wherein the
plurality of selective modified access regions are
entirely spaced apart along a width of the gate contact
in a second direction that is perpendicular to the first
direction, wherein the gate contact does not extend
through the barrier layer or one or more of the plurality
of selective modified access regions.

18. The method of claim 17, wherein forming the selec-
tive modified access regions comprises:

forming a mask on the barrier layer, the mask having a
plurality of openings therein that expose respective
portions of an upper surface of the barrier layer; and forming the selective modified access regions at the
portions of the upper surface of the barrier layer
exposed by the openings.

19. The method of claim 18, wherein forming the selec-
tive modified access regions comprises:

forming a sacrificial dielectric layer on the mask and the
barrier layer, wherein the sacrificial dielectric layer extends into the openings and contacts the barrier layer
at the portions of the upper surface of the barrier layer
exposed by the openings;

annealing the sacrificial dielectric layer and the barrier
layer; and removing the sacrificial dielectric layer.

20. The method of claim 19, wherein the sacrificial
dielectric layer comprises SiN, SiOx, AlN, AlO, and/or HfO.

21. The method of claim 18, wherein forming the selec-
tive modified access regions comprises:

selectively forming epitaxial layers on portions of the
upper surface of the barrier layer exposed by the
openings, wherein the epitaxial layers comprise a mate-
rial having a lower bandgap than the barrier layer.

22. The method of claim 21, wherein the epitaxial layers
are doped with n-type dopants.

23. The method of claim 18, wherein forming the selec-
tive modified access regions comprises:

implanting n-type dopants into portions of the upper
surface of the barrier layer exposed by the openings.

24. The method of claim 17, wherein the gate contact does
not contact the selective modified access regions.

25. The method of claim 17, further comprising forming
a doped drain region in the barrier layer wherein the drain
contact contacts the doped drain region, wherein the selec-
tive modified access regions contact the doped drain region.

26. The method of claim 17, wherein the selective modi-
fied access regions have a first width d1, and are spaced apart
on the barrier layer along the width of the gate contact by a
second width d2.

27. The method of claim 26, wherein the first width d1 is
between about 1 micron and 100 microns and the second
width d2 is between about 1 micron and 100 microns.

* * * * *